US 10,788,908 B2

(12) United States Patent
Jung et al.

(10) Patent No.: US 10,788,908 B2
(45) Date of Patent: Sep. 29, 2020

(54) ELECTRONIC DEVICE INCLUDING OPTICAL STRUCTURE

(71) Applicant: Samsung Electronics Co., Ltd., Suwon-si, Gyeonggi-do (KR)

(72) Inventors: Min Su Jung, Seoul (KR); Sung Won Hong, Hwaseong-si (KR); Jae Wan Kim, Suwon-si (KR); Kwang Tai Kim, Yongin-si (KR); Hyung Sup Byeon, Suwon-si (KR); Seung Ah Oh, Seoul (KR); Jung Won Lee, Anyang-si (KR); Jong Chul Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 73 days.

(21) Appl. No.: 15/974,132

(22) Filed: May 8, 2018

(65) Prior Publication Data

US 2018/0373370 A1 Dec. 27, 2018

(30) Foreign Application Priority Data

Jun. 22, 2017 (KR) ........................ 10-2017-0078924

(51) Int. Cl.
*G06F 3/041* (2006.01)
*H05K 5/00* (2006.01)
(Continued)

(52) U.S. Cl.
CPC ........ *G06F 3/0412* (2013.01); *H04M 1/0283* (2013.01); *H04M 1/22* (2013.01);
(Continued)

(58) Field of Classification Search
None
See application file for complete search history.

(56) References Cited

U.S. PATENT DOCUMENTS 7,478,942 B2   1/2009  Kim et al.
7,682,061 B2   3/2010  Jung et al.
(Continued)

FOREIGN PATENT DOCUMENTS

CN        105242810 A    1/2016
KR   10-2014-0086990 A    7/2014
(Continued)

OTHER PUBLICATIONS

Nickinson, Phil "The Galaxy S6 edge: Here's what that crazy curved display can do" https://www.androidcentral.com/galaxy-s6-series-and-galaxy-note-5-are-receiving-nougat-us Apr. 24, 2015) (Year: 2015).*

(Continued)

*Primary Examiner* — Matthew Yeung
(74) *Attorney, Agent, or Firm* — Jefferson IP Law, LLP

(57) ABSTRACT

An electronic device is provided. The electronic device includes a housing including a window disposed in at least a partial area of the housing and forming at least a portion of an outer surface of the electronic device, a touch screen display including an active area and a non-active area and accommodated in the housing such that at least a portion of the touch screen display is visually exposed through the window, at least one processor accommodated in the housing and electrically connected to the touch screen display, a memory accommodated in the housing and electrically connected to the at least one processor, and an optical layer disposed between the touch screen display and the window. A portion of a surface area of the optical layer that faces the active area of the touch screen display is formed in a bumpy structure.

19 Claims, 15 Drawing Sheets

(51) Int. Cl.
*H04M 1/22* (2006.01)
*H04M 1/02* (2006.01)
*H05B 45/10* (2020.01)
*H05K 1/18* (2006.01)
*H05K 5/03* (2006.01)
*H05B 45/20* (2020.01)

(52) U.S. Cl.
CPC ........... *H05B 45/10* (2020.01); *H05K 5/0017* (2013.01); *H05B 45/20* (2020.01); *H05K 1/181* (2013.01); *H05K 5/03* (2013.01); *H05K 2201/10106* (2013.01); *H05K 2201/10128* (2013.01)

(56) References Cited

U.S. PATENT DOCUMENTS

| | | | |
|---|---|---|---|
| 8,446,388 B2 | 5/2013 | Kim et al. | |
| 8,976,324 B2 | 3/2015 | Yang et al. | |
| 9,335,510 B2 | 5/2016 | Yang et al. | |
| 9,435,939 B2 | 9/2016 | Yang et al. | |
| 9,996,201 B2 | 6/2018 | Kim et al. | |
| 10,008,554 B2 | 6/2018 | Bae et al. | |
| 10,474,303 B2 | 11/2019 | Kim et al. | |
| 2004/0145915 A1 | 7/2004 | Kim et al. | |
| 2008/0112186 A1 | 5/2008 | Jung et al. | |
| 2012/0068959 A1 | 3/2012 | Kim et al. | |
| 2013/0083080 A1 | 4/2013 | Rappoport et al. | |
| 2014/0016071 A1 | 1/2014 | Yang et al. | |
| 2014/0037257 A1 | 2/2014 | Yang et al. | |
| 2014/0092283 A1 | 4/2014 | Yang et al. | |
| 2014/0092346 A1 | 4/2014 | Yang et al. | |
| 2015/0212626 A1* | 7/2015 | Kim | H04M 1/0268 345/174 |
| 2016/0253965 A1 | 9/2016 | Rappoport et al. | |
| 2016/0259205 A1 | 9/2016 | Kwak et al. | |
| 2016/0341892 A1 | 11/2016 | Yang et al. | |
| 2016/0351855 A1 | 12/2016 | Yang et al. | |
| 2017/0092703 A1* | 3/2017 | Bae | H01L 27/3232 |
| 2017/0277323 A1 | 9/2017 | Kim et al. | |
| 2018/0113241 A1* | 4/2018 | Powell | G02B 5/045 |
| 2018/0260055 A1 | 9/2018 | Kim et al. | |

FOREIGN PATENT DOCUMENTS

| | | |
|---|---|---|
| KR | 10-2015-0078212 A | 7/2015 |
| KR | 10-2017-0064418 A | 6/2017 |
| WO | 2014/011389 A2 | 1/2014 |

OTHER PUBLICATIONS

International Search Report dated Aug. 22, 2018, issued in International Patent Application No. PCT/KR2018/005261.
Extended European Search Report dated Apr. 3, 2020, issued in European Application No. 18821496.9.

* cited by examiner ns filed on Jun. 22, 2017, in the Korean
ELECTRONIC DEVICE INCLUDING OPTICAL STRUCTURE

CROSS-REFERENCE TO RELATED APPLICATION(S)

This application is based on and claims priority under 35 U.S.C. § 119(a) of a Korean patent application number 10-2017-0078924, filed on Jun. 22, 2017, in the Korean Intellectual Property Office, the disclosure of which is incorporated by reference herein in its entirety.

BACKGROUND

1. Field

The disclosure relates to an electronic device including an optical structure.

2. Description of Related Art

In an effort to aim for an interaction with a user, an electronic device supports various types of interfaces. Among them, a display that explicitly provides processing of recognition (e.g., input) and representation (e.g., output) of information resources is being spotlighted as a core interface for convergence of the electronic device and the user. Correspondingly, a recent display has evolved into a higher-quality input/output device, based on an improvement in software or hardware, and one example is a large area display (e.g., a full screen display).

The above information is presented as background information only to assist with an understanding of the disclosure. No determination has been made, and no assertion is made, as to whether any of the above might be applicable as prior art with regard to the disclosure.

SUMMARY

A large area display may require an improvement in mounting structures of various types of interconnection wires or electronic components hidden in a bezel area of an electronic device and may need additional pixels due to the expansion of an active area. Therefore, the large area display may have a limitation in compactness or slimness of the electronic device, or may cause a rise in manufacturing cost.

Aspects of the disclosure are to address at least the above-mentioned problems and/or disadvantages and to provide at least the advantages described below. Accordingly, an aspect of the disclosure is to provide an electronic device for implementing a large area display, based on an optical structure formed in an area of the electronic device.

In accordance with an aspect of the disclosure, an electronic device is provided. The electronic device includes a housing including a window disposed in at least a partial area of the housing and forming at least a portion of an outer surface of the electronic device, a touch screen display including an active area and a non-active area and accommodated in the housing such that at least a portion of the touch screen display is visually exposed through the window, at least one processor accommodated in the housing and electrically connected to the touch screen display, a memory accommodated in the housing and electrically connected to the at least one processor, and an optical layer including at least one of a first area between an edge region of the active area and the window and a second area between the non-active area and the window, wherein at least a portion of the first area is formed to face a second direction while forming a first obtuse angle with the first direction.

According to an embodiment, a portion of a surface area of the optical layer that faces the active area of the touch screen display may be formed in a bumpy structure.

According to various embodiments, ambient light may be generated at an edge of an active area of a display to provide an effect of making the active area look larger.

According to various embodiments, by making the active area look larger, it is possible to create an immersive viewing environment when outputting contents and to improve design aesthetics of an electronic device.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
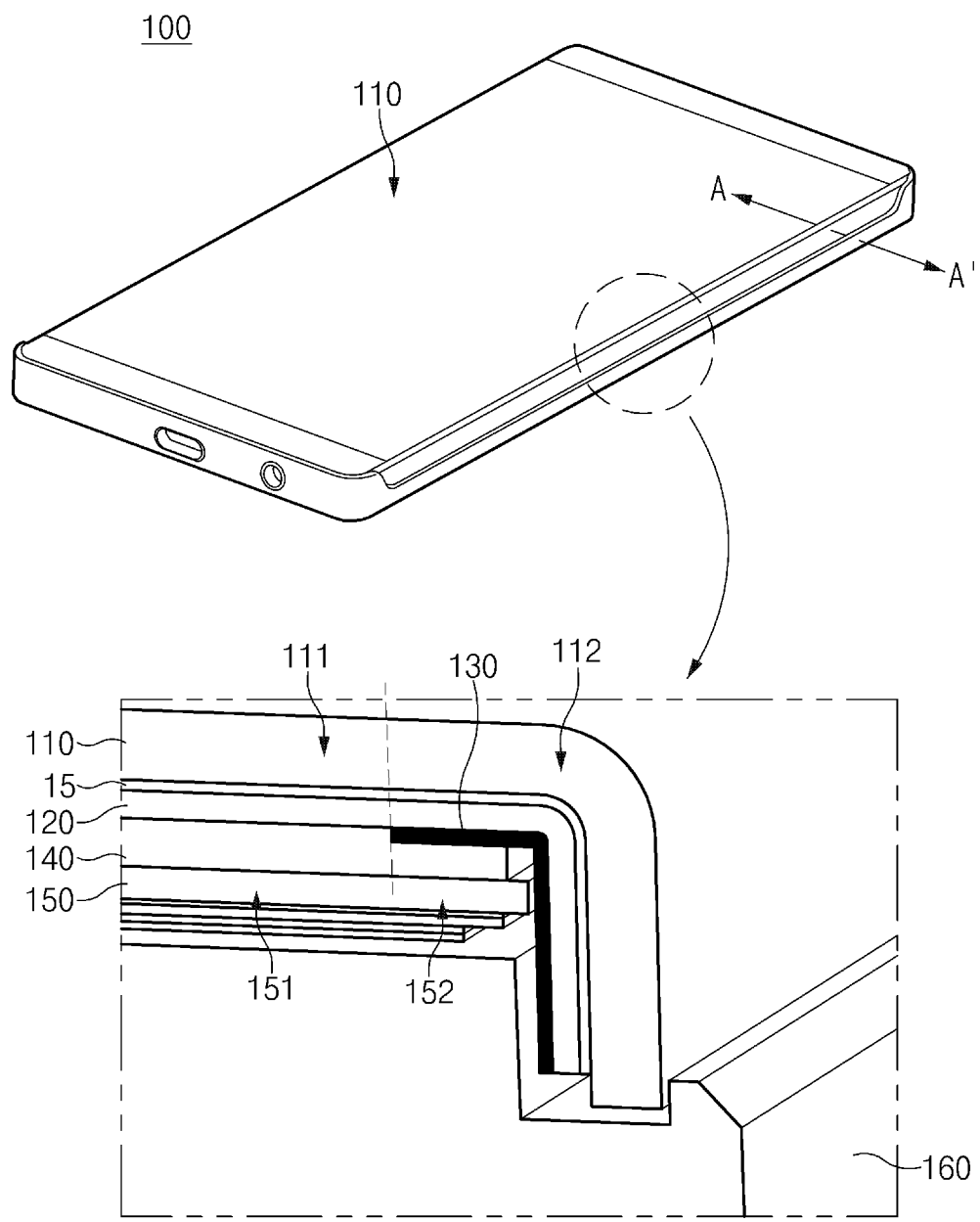
FIG. 1 illustrates an electronic device and a section of the electronic device according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The term "include," "comprise," and "have", or "may include," or "may comprise" and "may have" used herein indicates disclosed functions, operations, or existence of elements but does not exclude other functions, operations or elements.

For example, the expressions "A or B," or "at least one of A and/or B" may indicate A and B, A, or B. For instance, the expression "A or B" or "at least one of A and/or B" may indicate (1) at least one A, (2) at least one B, or (3) both at least one A and at least one B.

The terms such as "1st," "2nd," "first," "second," and the like used herein may refer to modifying various different elements of various embodiments of the disclosure, but are not intended to limit the elements. For instance, "a first user device" and "a second user device" may indicate different users regardless of order or importance. For example, a first component may be referred to as a second component and vice versa without departing from the scope of the disclosure.

In various embodiments of the disclosure, it is intended that when a component (for example, a first component) is referred to as being "operatively or communicatively coupled with/to" or "connected to" another component (for example, a second component), the component may be directly connected to the other component or connected through another component (for example, a third component). In various embodiments of the disclosure, it is intended that when a component (for example, a first component) is referred to as being "directly connected to" or "directly accessed" another component (for example, a second component), another component (for example, a third component) does not exist between the component (for example, the first component) and the other component (for example, the second component).

The expression "configured to" used in various embodiments of the disclosure may be interchangeably used with "suitable for," "having the capacity to," "designed to," "adapted to," "made to," or "capable of" according to the situation, for example. The term "configured to" may not necessarily indicate "specifically designed to" in terms of hardware. Instead, the expression "a device configured to" in some situations may indicate that the device and another device or part are "capable of." For example, the expression "a processor configured to perform A, B, and C" may indicate a dedicated processor (for example, an embedded processor) for performing a corresponding operation or a general purpose processor (for example, a central processing unit (CPU) or application processor (AP)) for performing corresponding operations by executing at least one software program stored in a memory device.

Terms used in various embodiments of the disclosure are used to describe certain embodiments of the disclosure, but are not intended to limit the scope of other embodiments. The terms of a singular form may include plural forms unless they have a clearly different meaning in the context. Otherwise, all terms used herein may have the same meanings that are generally understood by a person skilled in the art. In general, terms defined in a dictionary should be considered to have the same meanings as the contextual meaning of the related art, and, unless clearly defined herein, should not be understood differently or as having an excessively formal meaning. In any case, even the terms defined in the specification are not intended to be interpreted as excluding embodiments of the disclosure.

An electronic device according to various embodiments of the disclosure may include at least one of a smartphone, a tablet personal computer (PC), a mobile phone, a video telephone, an electronic book reader, a desktop PC, a laptop PC, a netbook computer, a workstation, a server, a personal digital assistant (PDA), a portable multimedia player (PMP), a Motion Picture Experts Group (MPEG-1 or MPEG-2) audio layer 3 (MP3) player, a mobile medical device, a camera, or a wearable device. The wearable device may include at least one of an accessory-type device (e.g., a watch, a ring, a bracelet, an anklet, a necklace, glasses, a contact lens, a head-mounted device (HMD)), a textile- or clothing-integrated-type device (e.g., an electronic apparel), a body-attached-type device (e.g., a skin pad or a tattoo), or a bio-implantable-type device (e.g., an implantable circuit).

In some various embodiments of the disclosure, an electronic device may be a home appliance. The smart home appliance may include at least one of, for example, a television (TV), a digital video/versatile disc (DVD) player, an audio, a refrigerator, an air conditioner, a cleaner, an oven, a microwave oven, a washing machine, an air cleaner, a set-top box, a home automation control panel, a security control panel, a TVbox (e.g., Samsung HomeSync™, Apple TV™, or Google TV™), a game console (e.g., Xbox™ or PlayStation™), an electronic dictionary, an electronic key, a camcorder, or an electronic picture frame.

In other various embodiments of the disclosure, an electronic device may include at least one of various medical devices (e.g., various portable medical measurement devices (e.g., a blood glucose measuring device, a heart rate measuring device, a blood pressure measuring device, a body temperature measuring device, or the like), a magnetic resonance angiography (MRA), a magnetic resonance imaging (MRI), a computed tomography (CT), a scanner, an ultrasonic device, or the like), a navigation device, a global navigation satellite system (GNSS), an event data recorder (EDR), a flight data recorder (FDR), a vehicle infotainment device, electronic equipment for vessels (e.g., a navigation system, a gyrocompass, or the like), avionics, a security device, a head unit for a vehicle, an industrial or home robot, an automatic teller machine (ATM), a point of sales (POS) device of a store, or an Internet of things (IoT) device (e.g., a light bulb, various sensors, an electric or gas meter, a sprinkler, a fire alarm, a thermostat, a streetlamp, a toaster, exercise equipment, a hot water tank, a heater, a boiler, or the like).

According to various embodiments of the disclosure, an electronic device may include at least one of a part of furniture or a building/structure, an electronic board, an electronic signature receiving device, a projector, or a measuring instrument (e.g., a water meter, an electricity meter, a gas meter, a wave meter, or the like). An electronic device may be one or more combinations of the above-mentioned devices. An electronic device according to some various embodiments of the disclosure may be a flexible device. An electronic device according to an embodiment of the disclosure is not limited to the above-mentioned devices, and may include new electronic devices with the development of new technology.

Hereinafter, an electronic device according to various embodiments of the disclosure will be described in more detail with reference to the accompanying drawings. The term "user" used herein may refer to a person who uses an electronic device or may refer to a device (e.g., an artificial intelligence electronic device) that uses an electronic device.

FIG. 1 illustrates an electronic device and a section of the electronic device according to an embodiment of the disclosure.

Referring to FIG. 1, a cover glass 110 (or a window) may be disposed to cover at least a partial area of an electronic device 100. The cover glass 110 may function as an interface through which to apply a user input (e.g., a touch, a drag, a sweep, or the like), or may function as a plate for shielding the interior of the electronic device 100 from the outside. For example, the cover glass 110 may cover the entire front surface of the electronic device 100. The cover glass 110 may extend downwards at a specified angle (e.g., about 90 degrees) from edges of the front surface of the electronic device 100 and may additionally cover at least a portion of side surfaces of the electronic device 100. Distal ends of the extending areas of the cover glass 110 may be fastened or attached to an area of a housing that forms at least a portion of the exterior of the electronic device 100 (or a bracket 160 constituting the housing) such that the cover glass 110 is integrated with the housing.

According to an embodiment, an optical layer 120 (or a first optical layer) and a display 150 (or a display panel) may be sequentially disposed below the cover glass 110. For example, the optical layer 120 may adhere to a rear surface of the cover glass 110 by using a first optically adhesive member 15 (e.g., an optically clear adhesive (OCA)), and the display 150 may be stuck to the optical layer 120 by using a second optically adhesive member 140 (e.g., an optically clear resin (OCR)) (or a second optical layer) that fills a space between the optical layer 120 and the display 150 and is cured by, for example, ultraviolet (UV) light, heat, a laser, or ultrasonic waves.

According to an embodiment, an opaque layer 130 may be disposed in an area between the optical layer 120 and the display 150. For example, the opaque layer 130 may adhere to, or be printed on, an area of a rear surface of the optical layer 120, and the second optically adhesive member 140 may fill a space below the opaque layer 130 and may be cured. Accordingly, the opaque layer 130 may be located to make contact with at least a partial area of the second optically adhesive member 140. The opaque layer 130 may include a through-section (or a transparent section) with a specified area in the center thereof and an opaque section extending from an edge of the through-section along the optical layer 120. Accordingly, the display 150 may be divided into an active area 151 that corresponds to the through-section of the opaque layer 130 and is visible from the outside and a non-active area 152 that corresponds to at least a portion of the opaque section and is not visible from the outside. Since the non-active area 152 of the display 150 is hidden by the opaque section, interconnection wires or electronic components (e.g., a display driver integrated circuit (IC)) associated with driving the display 150 may be mounted on the non-active area 152.

In regard to the above description, the cover glass 110 may be divided into a view area 111 that passes light emitted by the active area 151 of the display 150 via the through-section of the opaque layer 130 and a blind area 112 that shields the interior of the electronic device 100 that corresponds to the opaque section of the opaque layer 130. According to an embodiment, the blind area 112 may be visible in the color of the opaque section since the blind area 112 does not pass light emitted by the display 150.

According to an embodiment, the optical layer 120 (e.g., an optical sheet) disposed below the cover glass 110 may generate ambient light in the blind area 112 of the cover glass 110, based on light emitted by the display 150. In this regard, the optical layer 120 may diffuse at least a portion of the light emitted by the active area 151 of the display 150 at various angles to input the diffused light to the blind area 112 of the cover glass 110. According to an embodiment, at least a portion of the light refracted by the optical layer 120 at a predetermined angle and input to the blind area 112 may be directed toward an external medium (e.g., air) at an incidence angle greater than or equal to a critical angle. In this case, total reflection of light may occur in the blind area 112, and ambient light may be generated in at least a portion of the blind area 112, based on the total reflection of light. Hereinafter, various embodiments associated with generating the ambient light and structural or functional relationships between elements of the electronic device 100 that implement the ambient light will be described.

Figure 2:
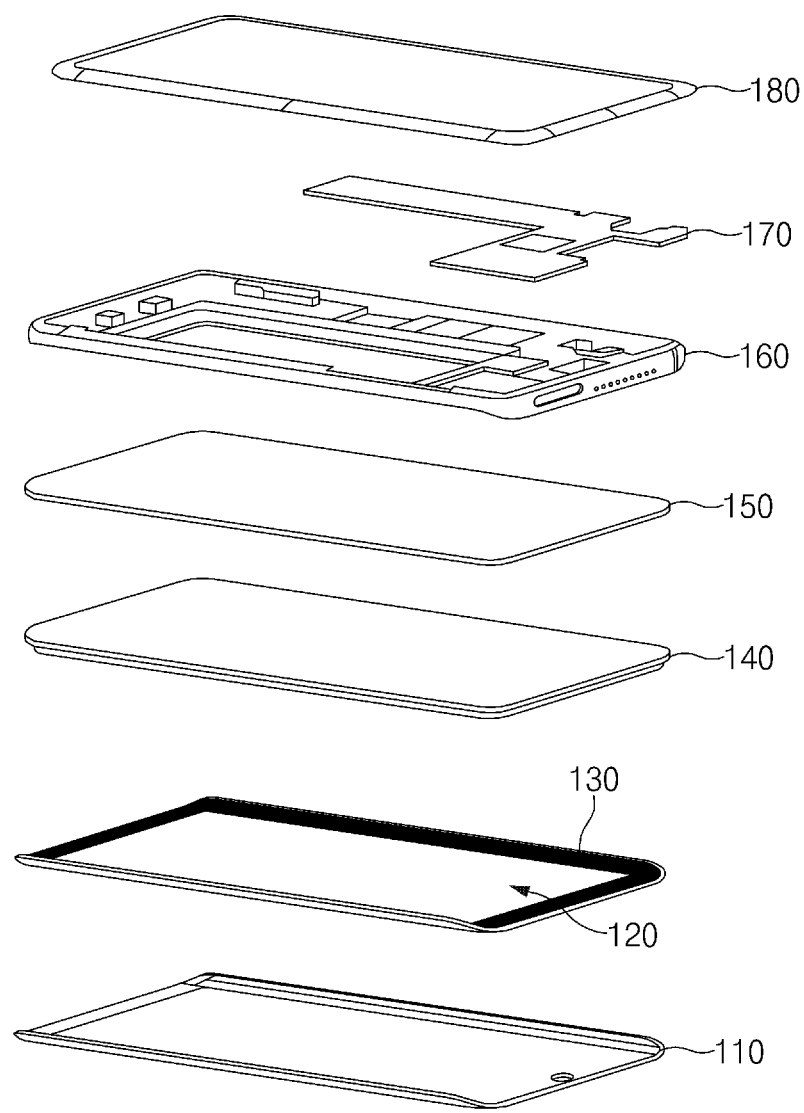
FIG. 2 illustrates some elements of an electronic device according to an embodiment of the disclosure.

FIG. 2 illustrates some elements of an electronic device according to an embodiment of the disclosure. In FIG. 2, elements identical or corresponding to the elements described with reference to FIG. 1 may be provided with identical reference numerals, and repetitive descriptions thereof will be omitted.

Referring to FIG. 2, the electronic device 100 may include at least one of the cover glass 110 (or the window), the optical layer 120 (or the first optical layer), the second optically adhesive member 140 (or the second optical layer), the display 150 (or the touch screen display), the bracket 160, a first printed circuit board 170, and a rear case 180 that are stacked or arranged in a specified sequence. The opaque layer 130 including the through-section and the opaque section may adhere to, or be printed on, a surface of the optical layer 120 illustrated in FIG. 2, and therefore the optical layer 120 may be understood as being integrated with the opaque layer 130. Furthermore, the second optically adhesive member 140 may be understood as an object into which a liquid optical material (e.g., a resin) is cured to correspond to the integrated shape of the optical layer 120 and the opaque layer 130.

According to various embodiments, the electronic device 100 may not include at least one of the above-described elements, or may further include other element(s). For example, the electronic device 100 may further include the first optically adhesive member 15 (see FIG. 1) that supports adhesion between the cover glass 110 and the optical layer 120. Furthermore, the electronic device 100 may further include at least one processor, a memory, a wireless communication circuit, or the like, in addition to the above-described elements. The processor may be electrically connected to other elements (e.g., the display 150, the memory, the wireless communication circuit, and the like) of the electronic device 100 to perform overall control over the elements, communication operations, data processing, or the like. The memory may store commands, information, or data associated with operating functions of elements (e.g., the display 150, the processor, and the wireless communication circuit). Furthermore, the memory may store at least one application program associated with operating functions of the electronic device 100. The wireless communication circuit may establish wired or wireless communication with at least one external device according to a defined protocol. The wireless communication circuit may be in communication with the external device based on the wired or wireless communication to transmit and receive various types of data, information, or signals. According to various embodiments, the electronic device 100 may further include at least a part of elements of an electronic device 901 that will be described below with reference to FIG. 9.

According to an embodiment, the cover glass 110, the bracket 160, and the rear case 180 may be integrated together by combining one or more areas thereof and may form a housing that serves as at least a portion of the exterior of the electronic device 100. For example, an area of the cover glass 110 may be coupled to an edge or a side surface of the bracket 160 through an adhesive member (e.g., an adhesive tape), and at least one protrusion (or receiving part) formed on an area (e.g., an edge) of the rear case 180 may be engaged with at least one receiving part (or protrusion) formed on an area (e.g., an edge) of the bracket 160. According to various embodiments, the rear case 180 may be detachable from the bracket 160, depending on the engagement structure between the protrusion and the receiving part, or may be integrally formed with the bracket 160 in a manufacturing process.

According to an embodiment, an edge region of the bracket 160 may extend upwards and/or downwards by a predetermined length, and therefore the housing formed by the cover glass 110, the bracket 160, and the rear case 180 may include an inner space. According to an embodiment, at least some of the elements (e.g., the optical layer 120, the second optically adhesive member 140, the display 150, the bracket 160, the first printed circuit board 170, the processor, the memory, and the wireless communication circuit) of the electronic device 100 may be arranged in the inner space of the housing.

The cover glass 110 (or the window) may be disposed above the display 150 to pass light generated by the display 150. The cover glass is merely an element name, and the material of the cover glass 110 is not limited to glass. For example, the cover glass 110 may include a transparent material, such as alumina silicate, soda lime, sapphire, or the like, and any material capable of transmitting light may be used for the cover glass 110. According to an embodiment, the cover glass 110 may extend from an area (e.g., an edge) thereof toward the bracket 160 at a specified angle (e.g., about 90 degrees), and the extending area of the cover glass 110 may face at least one side surface of the display 150.

The optical layer 120 may include, for example, polyethylene terephthalate (PET). The optical layer 120 may have an optical pattern (e.g., a prism) with a specified shape on an area thereof, or a sheet or layer including the optical pattern may adhere to an area of the optical layer 120. According to an embodiment, the optical layer 120 may diffuse (or refract) at least a portion of light emitted by the active area 151 (see FIG. 1) of the display 150 in at least one direction (or angle), based on the optical pattern.

According to various embodiments, the optical layer 120 may have an area corresponding to the entire area of the display 150, and an edge region of the optical layer 120 may extend along the extending area of the cover glass 110. In other words, the optical layer 120 may have a shape similar to that of the cover glass 110. In this regard, the opaque layer 130 that adheres to a surface of the optical layer 120 may extend along the extending area of the optical layer 120 and may have a shape similar to that of the edge region of the optical layer 120. According to various embodiments, the optical layer 120 may have, in the center thereof, a specified through-area that overlaps only at least a portion of the active area 151 (see FIG. 1) (e.g., an edge region of the active area 151) of the display 150. The area of the optical layer 120 that overlaps the active area 151 may be varied in consideration of the intensity or amount of ambient light to be generated.

The second optically adhesive member 140 may support adhesion or fixation between some elements (e.g., the optical layer 120, the display 150, and the like). According to an embodiment, at least a partial area of the optical layer 120 and/or the second optically adhesive member 140 may include an optically clear material in relation to light transmittance since the optical layer 120 and/or the second optically adhesive member 140 is disposed above the display 150.

The display 150 may output various types of contents (e.g., text, an image, a video, an icon, a symbol, and the like). The display 150 may include a rigid display, and at least a partial area (e.g., the active area 151) of the display 150 may be visually exposed through the cover glass 110. According to an embodiment, the display 150 may include a display driver IC (or a display driving circuit). The display driver IC may transfer an image (e.g., still image or video) signal from the processor to the display 150 at a specified frame rate. According to various embodiments, the display 150 may include a touch screen display. In this case, the cover glass 110 (or the window) may be included as a part of the touch screen display.

The first printed circuit board 170 may have at least one electronic component or electronic element (e.g., the processor, the memory, the wireless communication circuit, or various types of electronic circuits) mounted thereon, which is associated with operating functions of the electronic device 100. According to an embodiment, a plurality of first printed circuit boards 170 may be provided, and at least some of the plurality of first printed circuit boards 170 may be electrically connected together.

Figure 3:
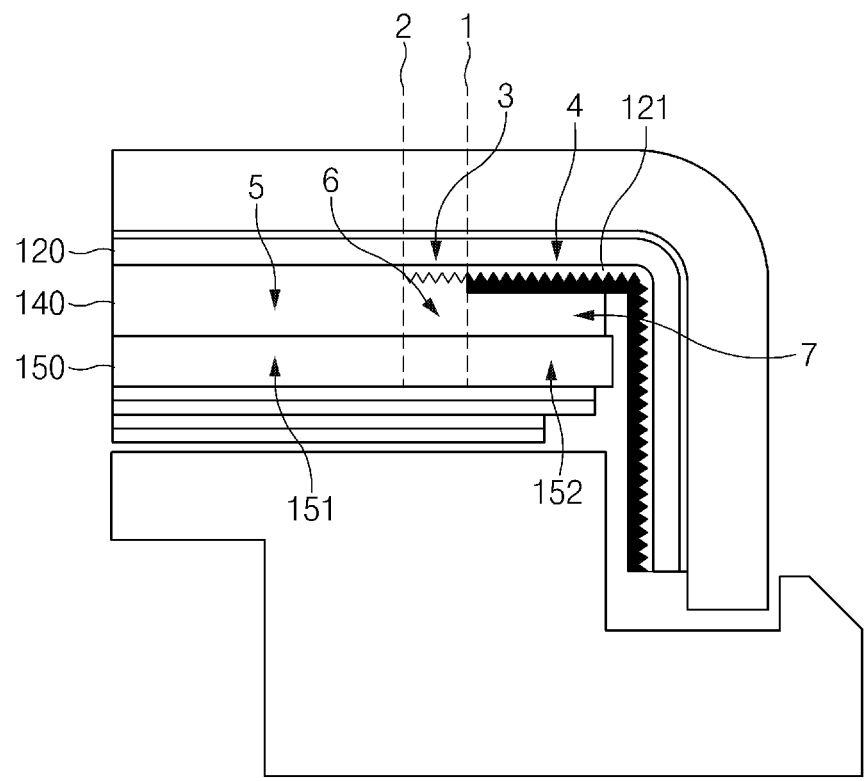
FIG. 3 illustrates a sectional view of an electronic device, which is taken along one direction, according to an embodiment of the disclosure.

FIG. 3 illustrates a sectional view of an electronic device, which is taken along one direction, according to an embodiment of the disclosure. The one direction may be understood as direction A-A' illustrated in FIG. 1, and one or more areas implemented in the optical layer 120 or the second optically adhesive member 140, which will be described below, may be defined in FIG. 3.

Referring to FIG. 3, the optical layer 120 may include one or more areas 3 and 4. For example, with respect to a first boundary 1 between the active area 151 and the non-active area 152 of the display 150, the optical layer 120 may include the first area 3 corresponding to the active area 151 (or the first area 3 overlapping at least a portion of an edge region of the active area 151 with respect to the first boundary 1 in the case where the optical layer 120 has a specified through-area in the center thereof) and the second area 4 corresponding to the non-active area 152 (e.g., including the extending area of the optical layer 120).

One or more areas 5, 6, and 7 included in the second optically adhesive member 140 may be divided from one another with respect to the first boundary 1 and a second boundary 2 depending on a presence or absence of an optical pattern 121 (or a sheet or layer including an optical pattern) implemented on the optical layer 120. For example, the second optically adhesive member 140 may include the third area 5 that does not overlap the optical pattern 121, the fourth area 6 between the first boundary 1 and the second boundary 2, and the fifth area 7 corresponding to the non-active area 152 of the display 150. According to various embodiments, the one or more areas of the second optically adhesive member 140 may be understood as the third area 5 corresponding to a region of the active area 151 of the display 150 except for the edge region, the fourth area 6 corresponding to the edge region of the active area 151, and the fifth area 7 corresponding to the non-active area 152.

According to an embodiment, the one or more boundaries 1 and 2 may be logical or virtual boundaries, and the one or more areas 3, 4, 5, 6, and 7 defined based on the boundaries 1 and 2 may be logical or virtual areas. Furthermore, the one or more areas 3 and 4 included in the optical layer 120 and the one or more areas 5, 6, and 7 included in the second optically adhesive member 140 may include the same or similar characteristics.

Figure 4A:
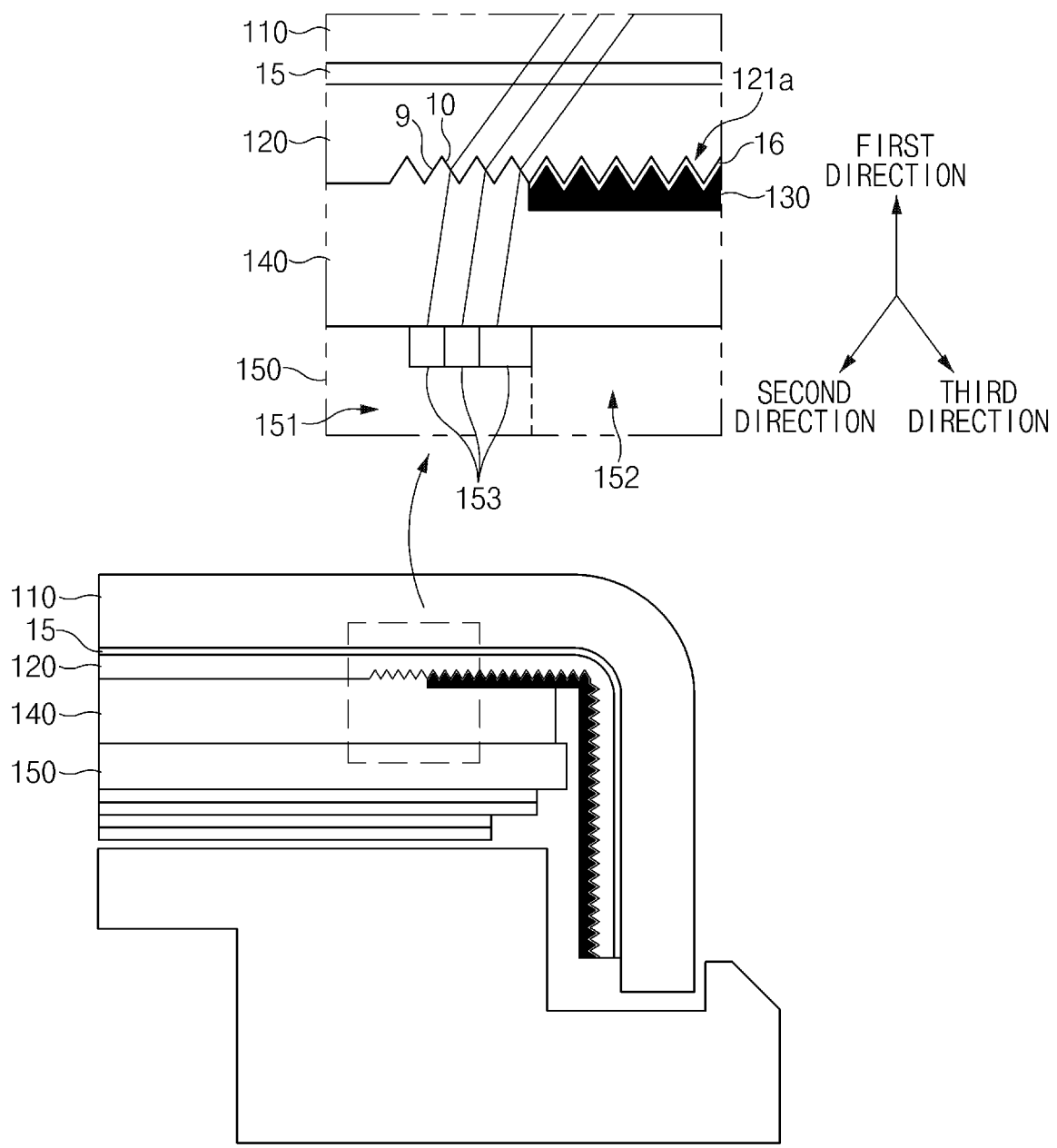
FIGS. 4A, 4B, and 4D illustrate a various optical structures of an electronic device according to various embodiments of the disclosure.
Figure 4B:
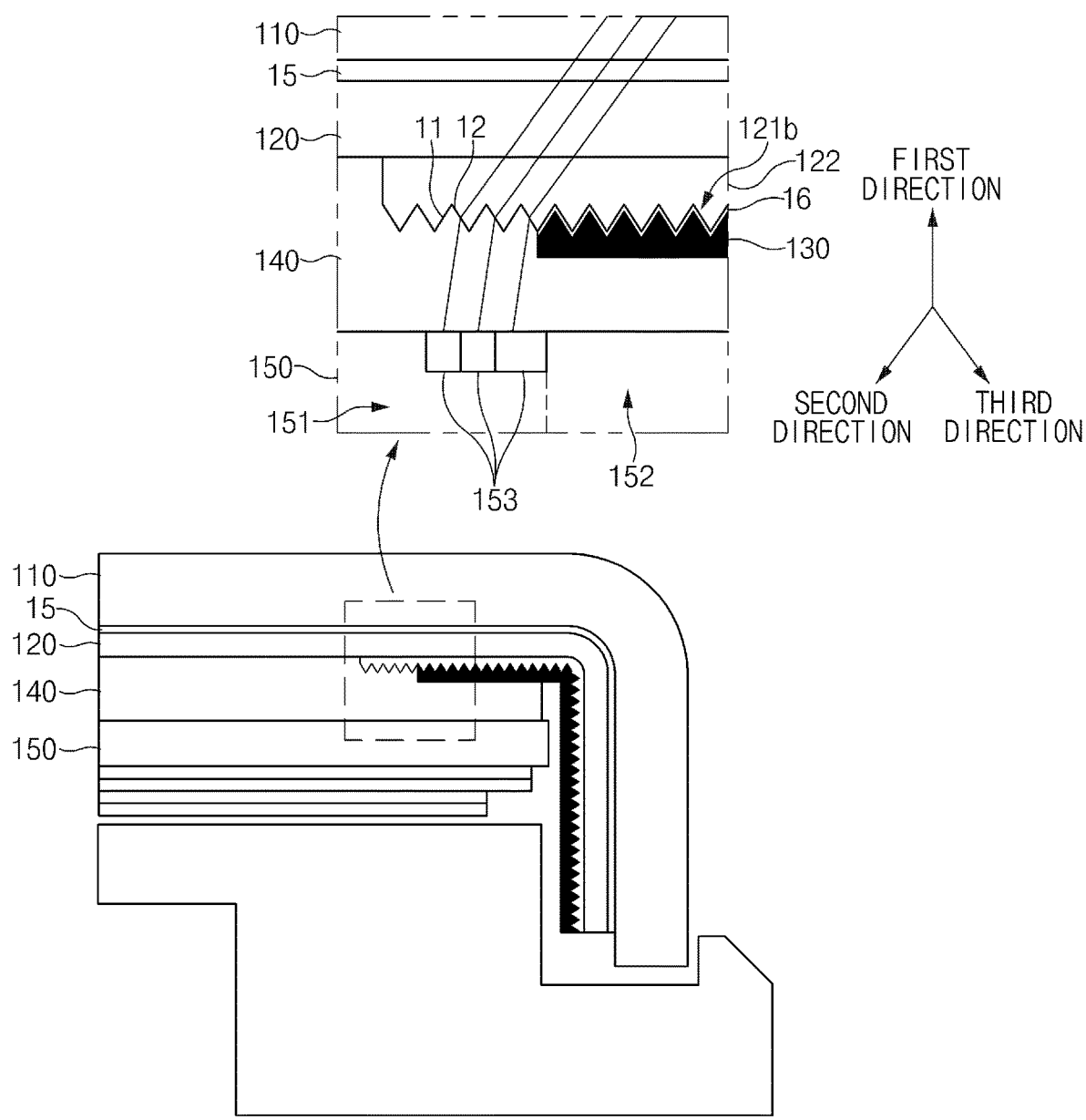
Figure 4C:
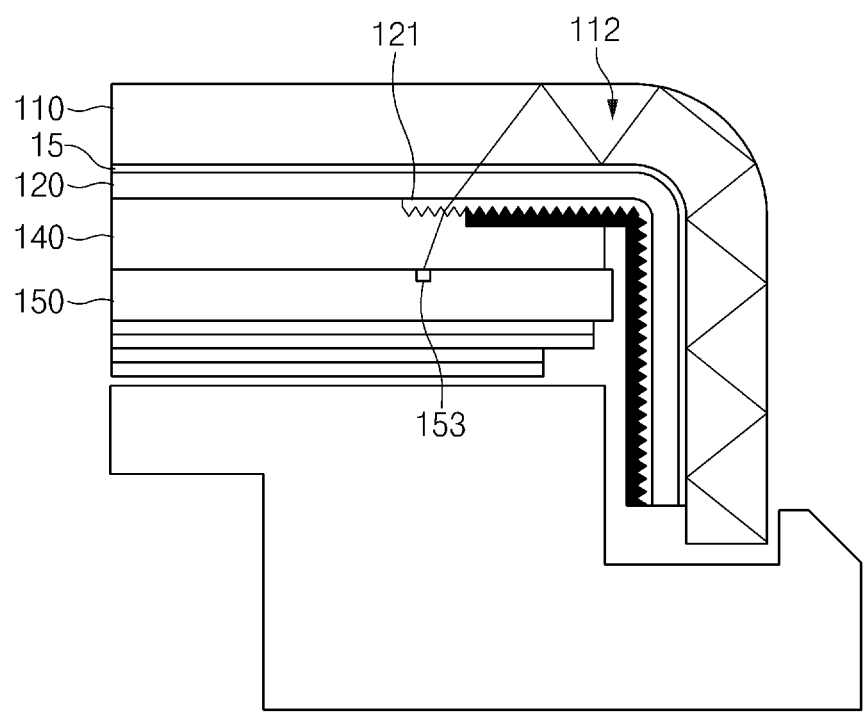
FIG. 4C illustrates ambient light generated based on an optical structure of an electronic device according to an embodiment of the disclosure.
Figure 4D:
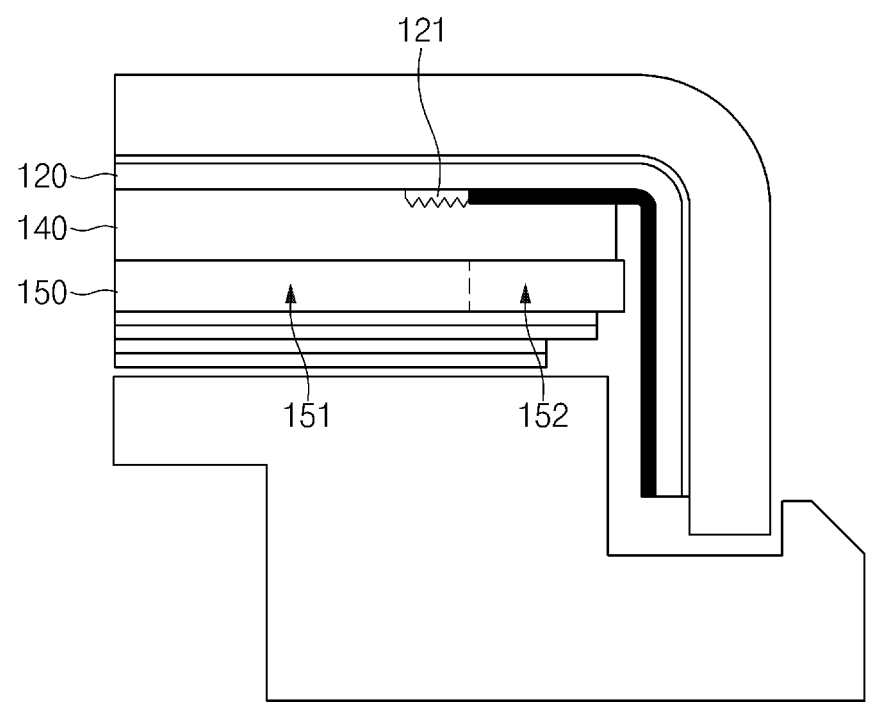

FIGS. 4A, 4B, and 4D illustrate various optical structures of the electronic device according to various embodiments of the disclosure, and FIG. 4C illustrates ambient light generated based on an optical structure of an electronic device according to an embodiment of the disclosure. Sectional views of the electronic device 100 illustrated in FIGS. 4A, 4B, 4C, and 4D may be understood as being taken along direction A-A' of FIG. 1. Furthermore, directions (e.g., first to third directions) mentioned through FIGS. 4A, 4B, 4C, and 4D may be relative directions with respect to the electronic device 100.

Referring to FIG. 4A, a first optical pattern 121a with a specified shape may be formed on at least a partial area (e.g., a partial area of the rear surface) of the optical layer 120. According to an embodiment, at least a portion of the first optical pattern 121a may overlap one or more pixels 153 (or one or more RGB elements) included in the active area 151 of the display 150. The first optical pattern 121a overlapping the one or more pixels 153 may diffuse (or refract) light emitted by the pixels 153 in various directions (or at various angles). Accordingly, at least a portion of the light emitted by the one or more pixels 153 may be input to the optical layer 120 while forming a specific incidence angle through the first optical pattern 121a.

According to an embodiment, the first optical pattern 121a may include one or more first surfaces 9 facing the second direction while forming a first obtuse angle with the first direction that the active area 151 and the non-active area 152 of the display 150 face and one or more second surfaces 10 facing the third direction while forming a second obtuse angle with the first direction. The first obtuse angle and the second obtuse angle may be identical to, or different from, each other. According to an embodiment, the first surfaces 9 and/or the second surfaces 10 may refract light emitted from the pixels 153 in various directions or at various angles.

According to an embodiment, a deposited layer 16 corresponding to the shape of the first optical pattern 121a may be disposed on at least a partial area of the first optical pattern 121a. The deposited layer 16 may be implemented with, for example, a material with a light reflection characteristic and may reflect external light input through the cover glass 110 to render gloss or texture. The opaque layer 130 may be disposed below the deposited layer 16, and the opaque section corresponding to an edge of the opaque layer 130 may have one surface corresponding to the shape of the deposited layer 16 (or the first optical pattern 121a) and an opposite surface implemented to be substantially flat.

As illustrated in FIG. 4A, the first optical pattern 121a may be implemented by a process of performing first processing (e.g., etching) on the rear surface of the optical layer 120. Alternatively, referring to FIG. 4B, a separate sheet (or layer) 122 including a second optical pattern 121b that functions identically or similarly to the first optical pattern 121a may be disposed on the rear surface of the optical layer 120. The sheet 122 may be disposed on the rear surface of the optical layer 120 through a specified process (e.g., UV molding), and the second optical pattern 121b on the sheet 122 may be implemented through, for example, second processing (e.g., laser processing or numerical control machining). The second optical pattern 121b may include one or more third surfaces 11 corresponding to the first surfaces 9 of the first optical pattern 121a (e.g., surfaces facing the second direction while forming the first obtuse angle with the first direction) and one or more fourth surfaces 12 corresponding to the second surfaces 10 of the first optical pattern 121a (e.g., surfaces facing the third direction while forming the second obtuse angle with the first direction). The third surfaces 11 and/or the fourth surfaces 12 of the second optical pattern 121b may diffuse or refract light emitted from the one or more pixels 153 included in the active area 151 of the display 150, similarly to the first surfaces 9 and/or the second surfaces 10 of the first optical pattern 121a.

According to an embodiment, the one or more pixels 153 (or one or more RGB elements) included in the active area 151 may emit light with the same intensity as, or intensity similar to, that of light emitted by other pixels of the display 150. Alternatively, the one or more pixels 153 included in the active area 151 may be separately controlled by the processor and may emit light with higher intensity than other pixels of the display 150 in relation to the generation of ambient light in the cover glass 110.

Referring to FIG. 4C, at least a portion of light refracted by the optical pattern 121 (e.g., the first optical pattern 121a (see FIG. 4A) or the second optical pattern 121b (see FIG. 4B)) may enter the optical layer 120 made of a transparent material at a specific incidence angle, may pass through the optical layer 120 (or pass through the optical layer 120 and the first optically adhesive member 15), and may enter the cover glass 110. In this case, the specific incidence angle may be varied at the boundary between the mediums (e.g., the optical layer 120, the first optically adhesive member 15, and the cover glass 110), and the incidence angle variation may be insignificant in the case where upsilon characteristics of the mediums are similar to each other.

According to an embodiment, at least a portion of the light input to the cover glass 110 may be directed toward an external medium (e.g., air) at an incidence angle greater than or equal to a critical angle. In this case, the light with an incidence angle greater than or equal to the critical angle may be totally reflected in the blind area 112 of the cover glass 110. The totally reflected light may travel through the extending area of the cover glass 110 to reach the distal end of the extending area, and therefore ambient light according to driving (or light-emission) of the display 150 may be emitted from the distal end of the extending area.

According to an embodiment, the optical pattern 121 formed on the rear surface of the optical layer 120 may extend along at least a portion of the extending area (or side area) of the optical layer 120. The extending optical pattern 121 may change the direction or angle of at least a portion of the light totally reflected in the blind area 112 of the cover glass 110, and therefore ambient light may be emitted from the extending area, in addition to the distal end of the cover glass 110.

Referring to FIG. 4D, according to various embodiments, the optical pattern 121 may not include the above-described extending structure. For example, as illustrated in FIG. 4D, the optical pattern 121 may be formed in only an area that corresponds to a portion (e.g., an edge) of the active area 151 of the display 150.

Figure 5A:
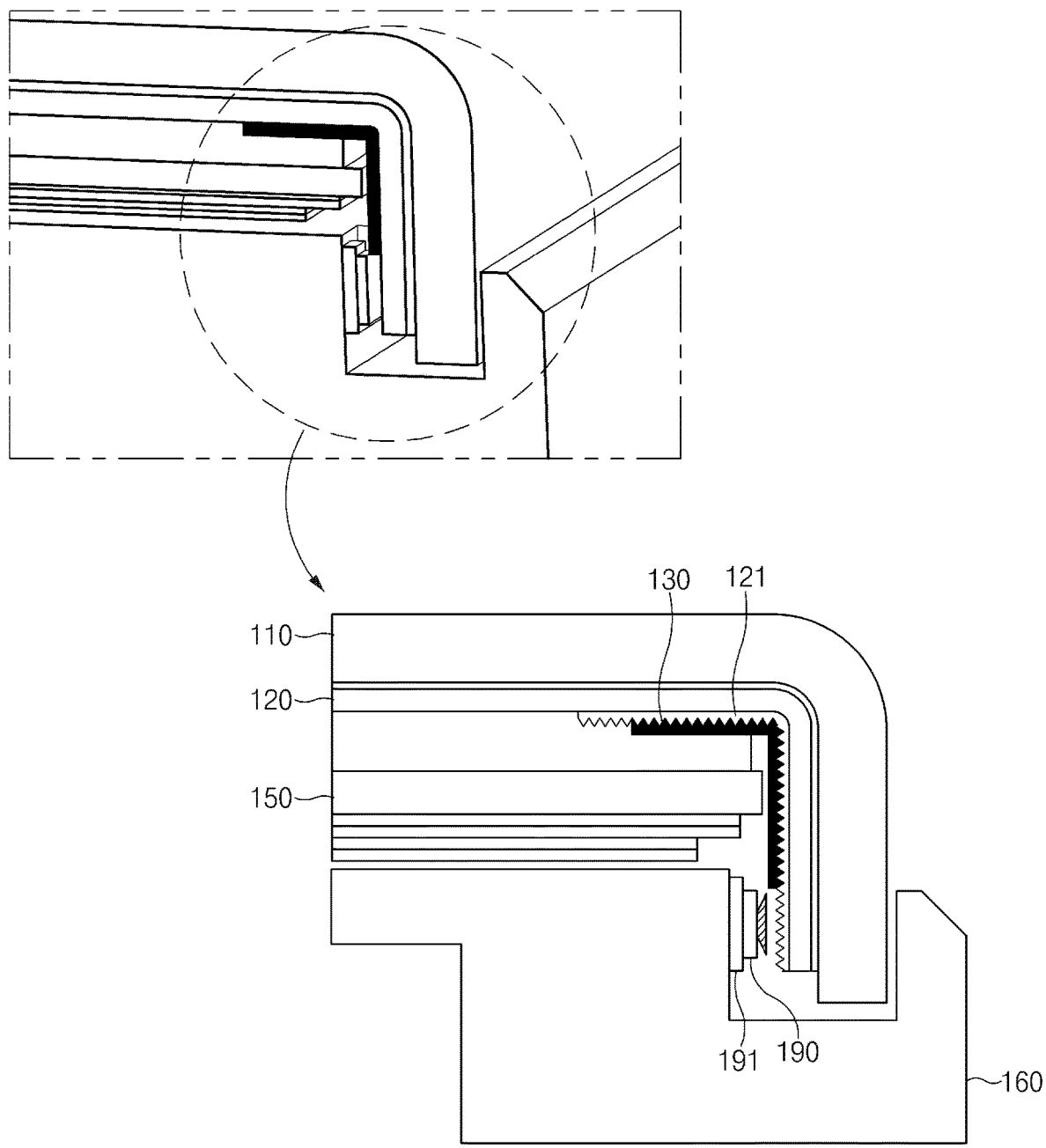
FIGS. 5A and 5B illustrates various optical structures of an electronic device according to various embodiments of the disclosure.
Figure 5B:
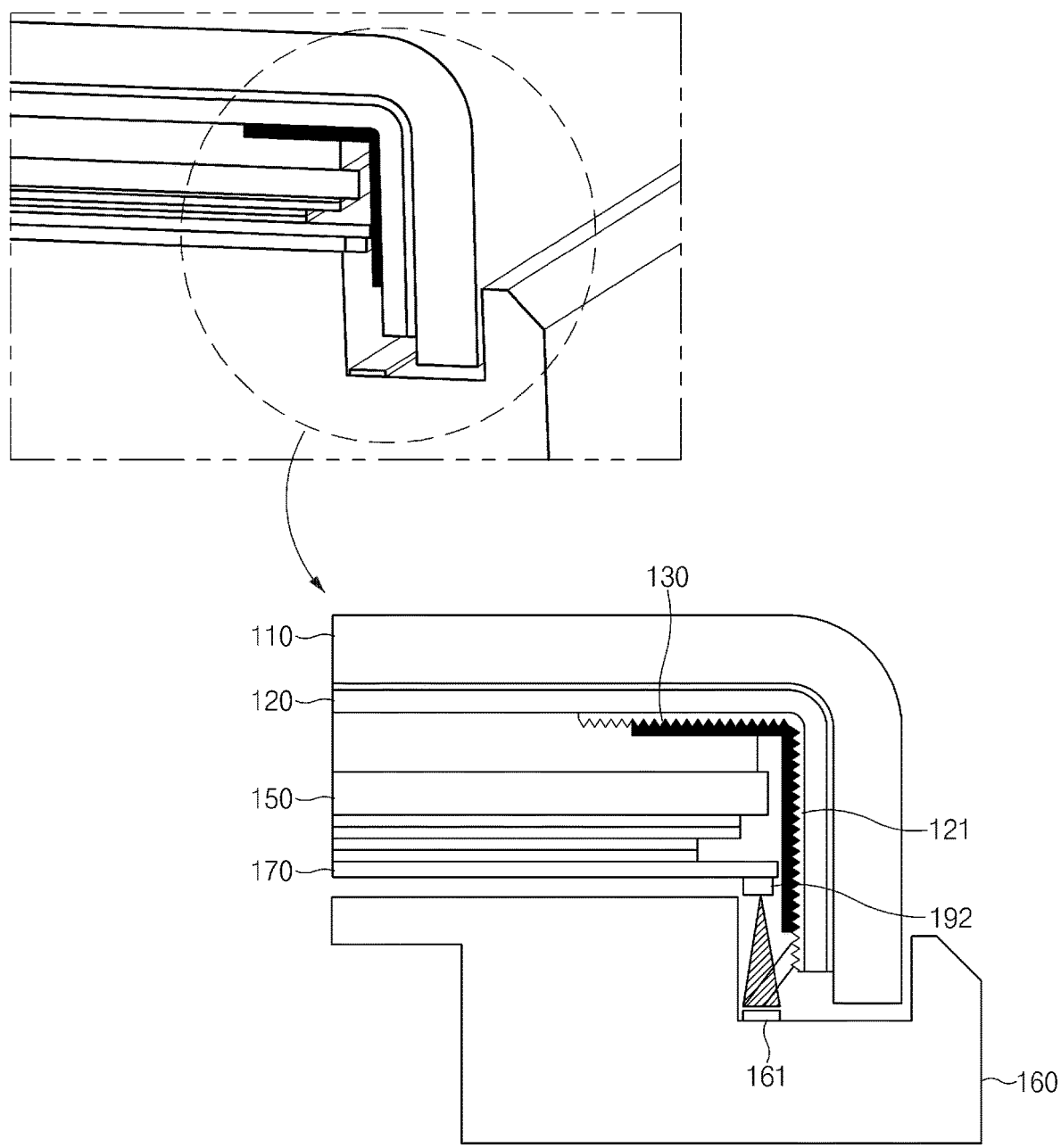

FIGS. 5A and 5B illustrate various optical structures of an electronic device according to various embodiments of the disclosure. In FIGS. 5A and 5B, structural or functional elements identical to those in the above description may be omitted, and the following description will be focused on different elements. Sectional views of the electronic device 100 illustrated in FIGS. 5A and 5B may be understood as being taken along direction A-A' of FIG. 1.

Referring to FIG. 5A, the electronic device 100 (see FIG. 1) may include a first light-emitting module 190 that functions as a separate light source, in addition to the one or more pixels 153 (see FIG. 4A) included in the active area 151 (see FIG. 4A) of the display 150. For example, the first light-emitting module 190 may be disposed in an area of the bracket 160 that faces the extending area (or side surface) of the cover glass 110.

According to an embodiment, the first light-emitting module 190 may include a light emitting diode (LED) element and a second printed circuit board 191 electrically connected to the display 150. The first light-emitting module 190 may be driven together with the display 150 to support the generation of ambient light, based on the LED element and the second printed circuit board 191. In this regard, the opaque layer 130 having a shape similar to that of the optical layer 120 as described above may not be formed at the distal end of the extending area of the optical layer 120. For example, an edge region (e.g., the opaque section) of the opaque layer 130 may extend along the shape of the optical layer 120 and then may extend only to a point substantially corresponding to the height of a side surface or an edge region of the bracket 160. Alternatively, the edge region of the opaque layer 130 may extend to a specified point, and the side surface or the edge region of the bracket 160 may extend to correspond to the specified point. Accordingly, light emitted by the first light-emitting module 190 may be input to the area not including the opaque layer 130 and may be refracted (or diffused) by the optical pattern 121 to generate ambient light in the extending area of the cover glass 110.

According to an embodiment, the first light-emitting module 190 may be controlled by a processor that refers to driving information of the display 150. For example, with reference to driving information, such as emission timing, light intensity, light color, or the like, of the display 150 (or the one or more pixels 153 included in the active area 151 of the display 150), the processor may control driving of the first light-emitting module 190 to correspond to the driving information of the display 150. Alternatively, the LED element and the second printed circuit board 191 of the first light-emitting module 190 may function irrespective of the display 150 to generate ambient light in the side area of the cover glass 110.

Referring to FIG. 5B, the electronic device 100 may include a second light-emitting module 192 that includes an LED element and functions similarly to the first light-emitting module 190. For example, the second light-emitting module 192 may be mounted on a first printed circuit board 170 (e.g., a main printed circuit board), which is electrically connected to the display 150, to face the bracket 160. In this regard, a reflection member 161 may be disposed in an area of the bracket 160 at which light emitted by the second light-emitting module 192 arrives. According to an embodiment, the reflection member 161 may refract (or reflect) at least a portion of the light emitted by the second light-emitting module 192 toward a side area of the cover glass 110. In this case, an edge region (e.g., the opaque section) of the opaque layer 130 may not be formed at the distal end of the extending area of the cover glass 110, similarly to the structure described above with reference to FIG. 5A. Accordingly, the light refracted by the reflection member 161 may enter the area not including the opaque layer 130 and may generate ambient light in the extending area of the cover glass 110, based on the optical pattern 121.

Figure 6:
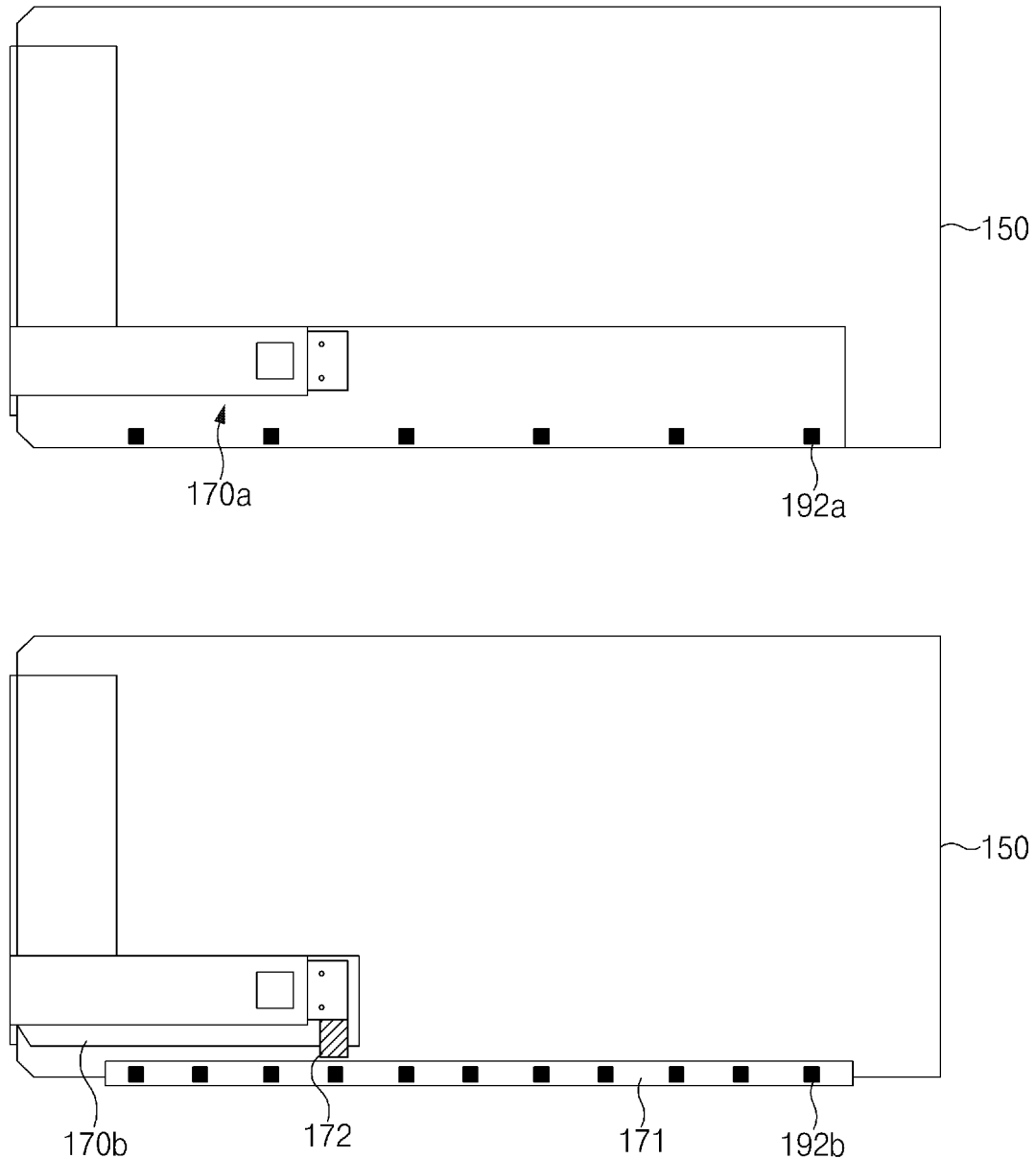
FIG. 6 illustrates various forms of a display associated with an optical structure of an electronic device according to an embodiment of the disclosure.

FIG. 6 illustrates various forms of a display associated with an optical structure of an electronic device according to an embodiment of the disclosure.

Referring to FIG. 6, the second light-emitting module 192 (see FIG. 5B) described above with reference to FIG. 5B may be mounted in the electronic device 100 (see FIG. 1) in various structures depending on the number of second light-emitting modules 192 provided. For example, a first plurality of second light-emitting modules 192a may be mounted at specified intervals on an area (e.g., edge) of a first printed circuit board 170a electrically connected to, or structurally integrated with, the display 150.

Furthermore, a second plurality of second light-emitting modules 192b may be mounted at specified intervals on a separate third printed circuit board 171, with the second plurality greater than the first plurality. According to an embodiment, the third printed circuit board 171 may be stacked and mounted on an area (e.g., an edge of the rear surface) of the display 150 and may be electrically connected to a first printed circuit board 170b integrated with the display 150, through a connector or interconnection wire 172. According to various embodiments, the first printed circuit board 170b may be formed in minimum size required to perform a function since the second light-emitting modules 192b are not mounted on the first printed circuit board 170b.

According to an embodiment, the first printed circuit board 170a or 170b or the third printed circuit board 171 is not limited to the shape illustrated in FIG. 6. For example, the first printed circuit board 170a or 170b or the third printed circuit board 171 may extend to, or be stacked on, an upper area of the display 150 illustrated in FIG. 6, based on the shape of the display 150. In this regard, the first or second plurality of second light-emitting modules 192a or 192b may be mounted on the first printed circuit board 170a or the third printed circuit board 171 that extends to, or is stacked on, the upper area of the display 150.

Figure 7A:
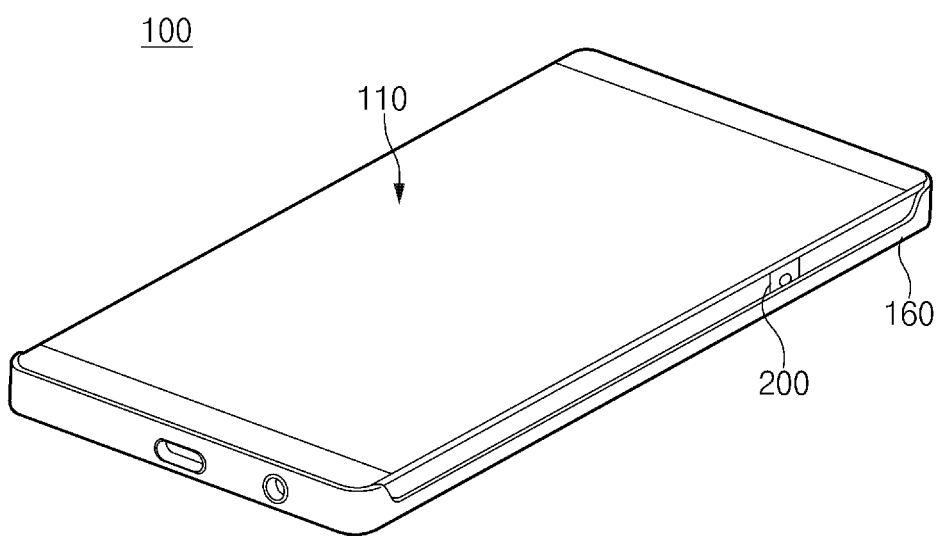
FIG. 7A illustrates an electronic device including a sensor module according to an embodiment of the disclosure.
Figure 7B:
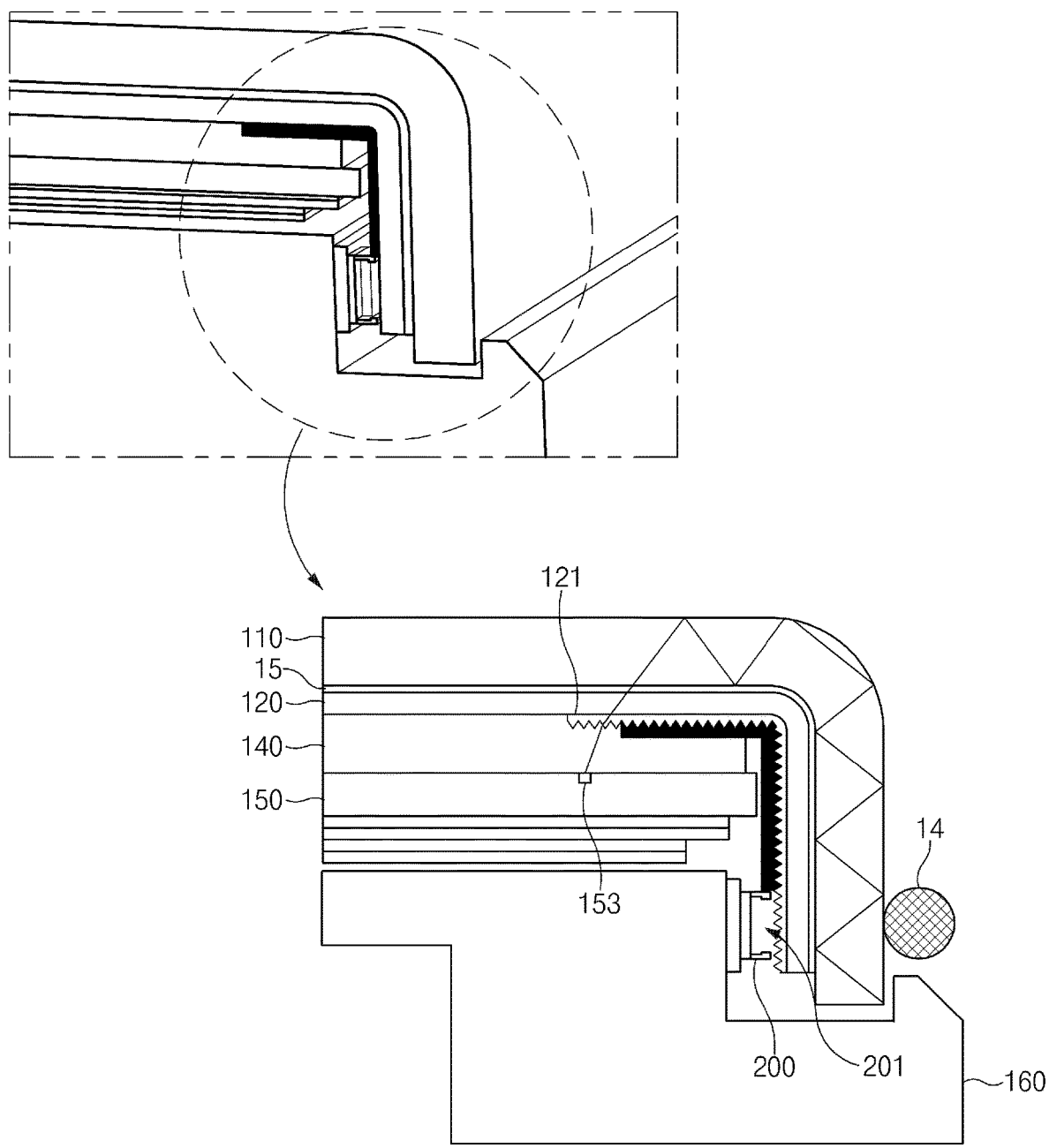
FIG. 7B illustrates another optical structure of an electronic device according to an embodiment of the disclosure.

FIG. 7A illustrates an electronic device including a sensor module according to an embodiment of the disclosure, and FIG. 7B illustrates another optical structure of an electronic device according to an embodiment of the disclosure.

Referring to FIGS. 7A and 7B, a sensor module 200 may be disposed on an area (e.g., a side surface) of the electronic device 100. According to an embodiment, the sensor module 200 may be disposed on an area of the bracket 160 that faces the extending area of the cover glass, and at least a portion of the sensor module 200 may be exposed through the cover glass 110 made of a transparent material. For example, in regard to the performance of a function (e.g., sensing), the sensor module 200 may be disposed so as not to overlap a specific element (e.g., the opaque layer 130 (see FIG. 5B)), and at least a portion of the sensor module 200 may be exposed through the cover glass 110.

According to an embodiment, the sensor module 200 may include a light-receiving part 201 that receives light. In this regard, as described above, at least a portion of light emitted from the one or more pixels 153 included in the active area 151 (see FIG. 4A) of the display 150 may be refracted (or diffused) by the optical pattern 121 and may be input to the cover glass 110. At this time, a portion of the incident light may be totally reflected in the blind area 112 (see FIG. 1) of the cover glass 110, and another portion of the incident light may be directed toward an external medium (e.g., air) at an incidence angle greater than or equal to a critical angle to pass through the cover glass 110. In the case where an object (e.g., a user's finger) contacts or approaches an adjacent area 14 of the cover glass 110 corresponding to the position of the light-receiving part 201 in this operation, at least a portion of the light having passed through the cover glass 110 may be reflected by the object, and therefore characteristics (e.g., the amount or intensity) of light directed toward the light-receiving part 201 may be varied. Based on this, the sensor module 200 may detect the contact or approach of the object, and the functional operation of the sensor module 200 (e.g., the detection of the object) may support the receipt of a user input related to control of the electronic device 100.

Figure 8A:
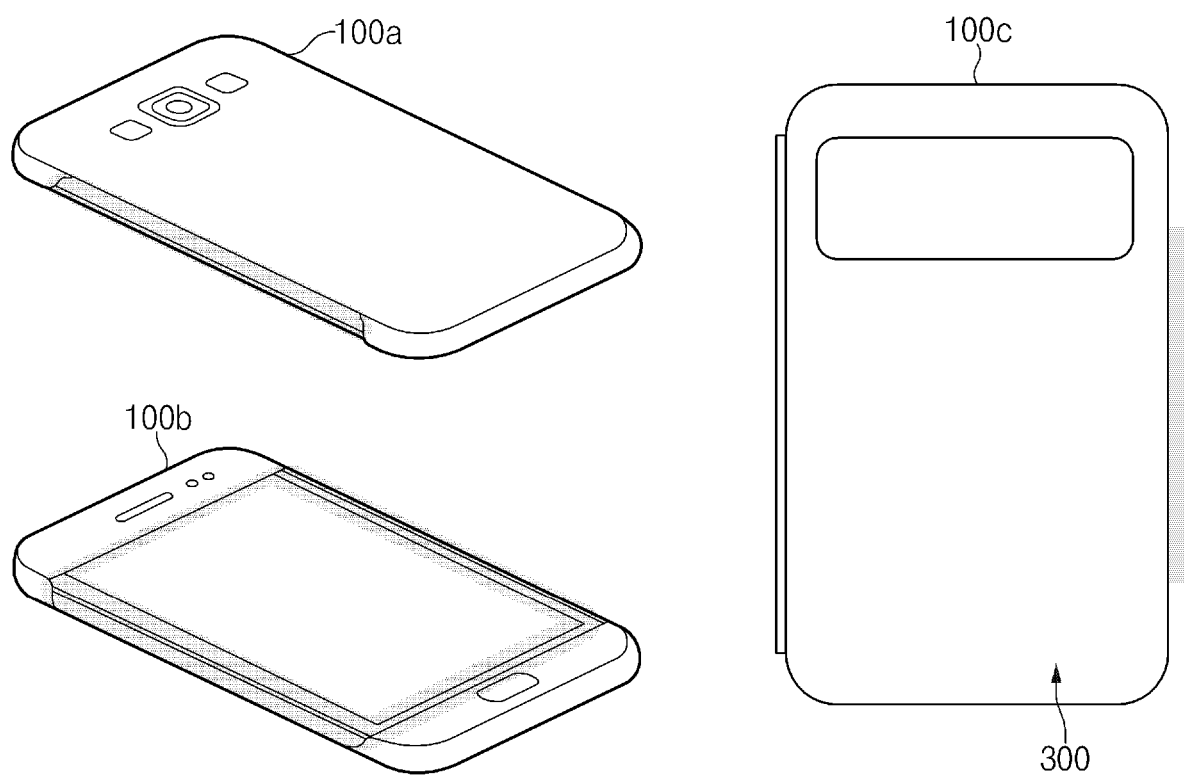
FIG. 8A illustrates examples of operating an electronic device according to an embodiment of the disclosure.
Figure 8B:
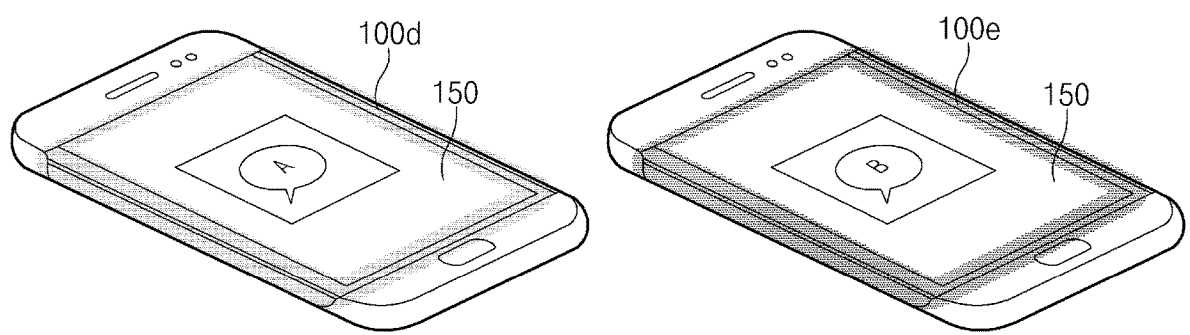
FIG. 8B illustrates an electronic device emitting ambient light according to an embodiment of the disclosure.

FIG. 8A illustrates examples of operating an electronic device according to an embodiment of the disclosure, and FIG. 8B illustrates an electronic device emitting ambient light according to an embodiment of the disclosure.

Referring to FIG. 8A, a user may not clearly recognize occurrence of a specified event (e.g., call incoming, message receiving, or system notification) in the case where the front side of an electronic device 100a is directed toward the ground, a sound function of an electronic device 100b is set to a mute function (or a vibration function), or at least a partial area of an electronic device 100c is covered with a cover accessory 300. However, the electronic device 100a, 100b, or 100c may provide visual notification for the event, based on ambient light generated in the blind area 112 (see FIG. 4C) of the cover glass 110 (see FIG. 4C) in response to the occurrence of the event.

According to an embodiment, a processor of the electronic device 100a, 100b, or 100c may variably control driving of a light source (e.g., the one or more pixels 153 included in the active area 151 of the display 150 (see FIG. 4), the first light-emitting module 190 (see FIG. 5A), or the second light-emitting module 192 (see FIG. 5B)) that contributes to generating the ambient light. For example, the processor may consistently maintain the generation of the ambient light or may repeatedly generate the ambient light every specified period in the case where the event continues for a specified period of time (e.g., a situation in which call incoming continues) or the user does not react to the event for the specified period of time (e.g., a situation in which the user does not check a message or system notification). In this case, the processor may control the driving of the light source to gradually increase the intensity, amount, or color of light emitted by the light source or the number of times that the light source is turned on/off.

Referring to FIG. 8B, the ambient light may be generated in a color that corresponds to an application program A or B executed in an electronic device 100d or 100e. In this regard, a processor of the electronic device 100d or 100e may construct a color-related index (or database) for at least one application program loaded or installed in the electronic device 100d or 100e. The processor may construct the index by mapping, onto each loaded or installed application program, a representative color (e.g., a color of an icon, a banner, or a theme of the application or a color with the highest percentage among one or more colors constituting an initial user interface of the application). According to an embodiment, the processor, when executing a specific application program (or controlling the execution), may identify a color corresponding to the specific application program in the index and may transmit the identified color information to a light source that contributes to generating the ambient light, through a display driver IC (or a display driving circuit). Accordingly, the light source contributing to generating the ambient light may emit light in the identified color. In this case, when viewed from outside the electronic device 100d or 100e, ambient light with a strip shape may be generated in the identified color (e.g., a color corresponding to the specific application program) in an edge region of the electronic device 100d or 100e (or a region of the cover glass 110 that corresponds to an edge of the display 150 or a region of the cover glass 110 that corresponds to the non-active area 152 (see FIG. 4A) of the display 150).

According to various embodiments, an electronic device may include a housing including a window disposed in at least a partial area of the housing and forming at least a portion of an outer surface of the electronic device, a touch screen display including an active area and a non-active area that face a first direction and accommodated in the housing such that at least a portion of the touch screen display is visually exposed through the window, at least one processor accommodated in the housing and electrically connected to the touch screen display, a memory accommodated in the housing and electrically connected to the at least one processor, and a first optical layer including at least one of a first area between an edge region of the active area and the window and a second area between the non-active area and the window. At least a portion of the first area may be formed to face a second direction while forming a first obtuse angle with the first direction.

According to various embodiments, the portion of the first area may include a first surface formed to face the second direction and a second surface formed to face a third direction while forming a second obtuse angle with the first direction.

According to various embodiments, the first surface and the second surface may be alternately formed on the at least a portion of the surface corresponding to the first area of the first optical layer.

According to various embodiments, the electronic device may further include at least one opaque layer disposed between the first optical layer and the non-active area.

According to various embodiments, the first optical layer may include an optical film having a portion that includes PET.

According to various embodiments, the electronic device may further a second optical layer disposed between the first optical layer and the touch screen display.

According to various embodiments, the second optical layer may include at least one of a third area between the active area except for the edge region and the window, a fourth area between the edge region and the window, or a fifth area between the non-active area and the window.

According to various embodiments, the second optical layer may include at least one of a transparent adhesive or a transparent resin.

According to various embodiments, the window may include a curved area that faces at least one side surface of the touch screen display.

According to various embodiments, the curved area of the window may be substantially perpendicular to a non-curved area of the window.

According to various embodiments, the first optical layer may include an extending area that extends to correspond to the curved area of the window.

According to various embodiments, the at least one opaque layer may extend to correspond to the extending area of the first optical layer.

According to various embodiments, the electronic device may further include a first light-emitting module accommodated in the housing and disposed to face the curved area of the window.

According to various embodiments, the at least one opaque layer may extend so as not to overlap area portion of the first light-emitting module.

According to various embodiments, the electronic device may further include a printed circuit board electrically connected to the touch screen display and a second light-emitting module disposed on an area of the printed circuit board.

According to various embodiments, the electronic device may further include a reflection member accommodated in the housing and disposed in an area of the housing that faces the second light-emitting module, to reflect a portion of light emitted by the second light-emitting module.

According to various embodiments, the touch screen display may include a rigid display.

According to various embodiments, the memory may store at least one instruction that, when executed, causes the at least one processor to display a user interface associated with execution of an application program on at least a partial area of a screen area of the touch screen display and to light the edge region of the active area in at least one color to show a strip shape through a window corresponding to an edge of the touch screen display or a window corresponding to the non-active area when viewed from outside the electronic device.

According to various embodiments, an electronic device may include a housing including a window disposed in at least a partial area of the housing and forming at least a portion of an outer surface of the electronic device, a touch screen display including an active area and a non-active area and accommodated in the housing such that at least a portion of the touch screen display is visually exposed through the window, at least one processor accommodated in the housing and electrically connected to the touch screen display, a memory accommodated in the housing and electrically connected to the at least one processor, and an optical layer disposed between the touch screen display and the window. A portion of a surface area of the optical layer that faces the active area of the touch screen display may be formed in a bumpy structure.

According to various embodiments, an electronic device may include a housing including a window disposed in a partial area of the housing and forming a portion of an outer surface of the electronic device, a touch screen display including an active area and a non-active area, the touch screen display being accommodated in the housing such that a portion of the touch screen display is visually exposed through the window, and an optical layer disposed between the touch screen display and the window. A portion of a surface area of the optical layer that faces the active area of the touch screen display may be formed to be uneven.

According to various embodiments, an electronic device may include a housing including a window disposed in at least a partial area of the housing and forming at least a portion of an outer surface of the electronic device, a touch screen display including an active area and a non-active area that face a first direction and accommodated in the housing such that at least a portion of the touch screen display is visually exposed through the window, at least one processor accommodated in the housing and electrically connected to the touch screen display, a memory accommodated in the housing and electrically connected to the processor, and a first optical layer including at least one of a first area corresponding to an area between an edge region of the active area and the window and a second area corresponding to an area between the non-active area and the window. The first optical layer may include, on at least a partial area of a surface thereof that faces the touch screen display, an optical pattern that refracts at least a portion of light emitted toward the first direction from the edge region of the active area, in a second direction different from the first direction.

Figure 9:
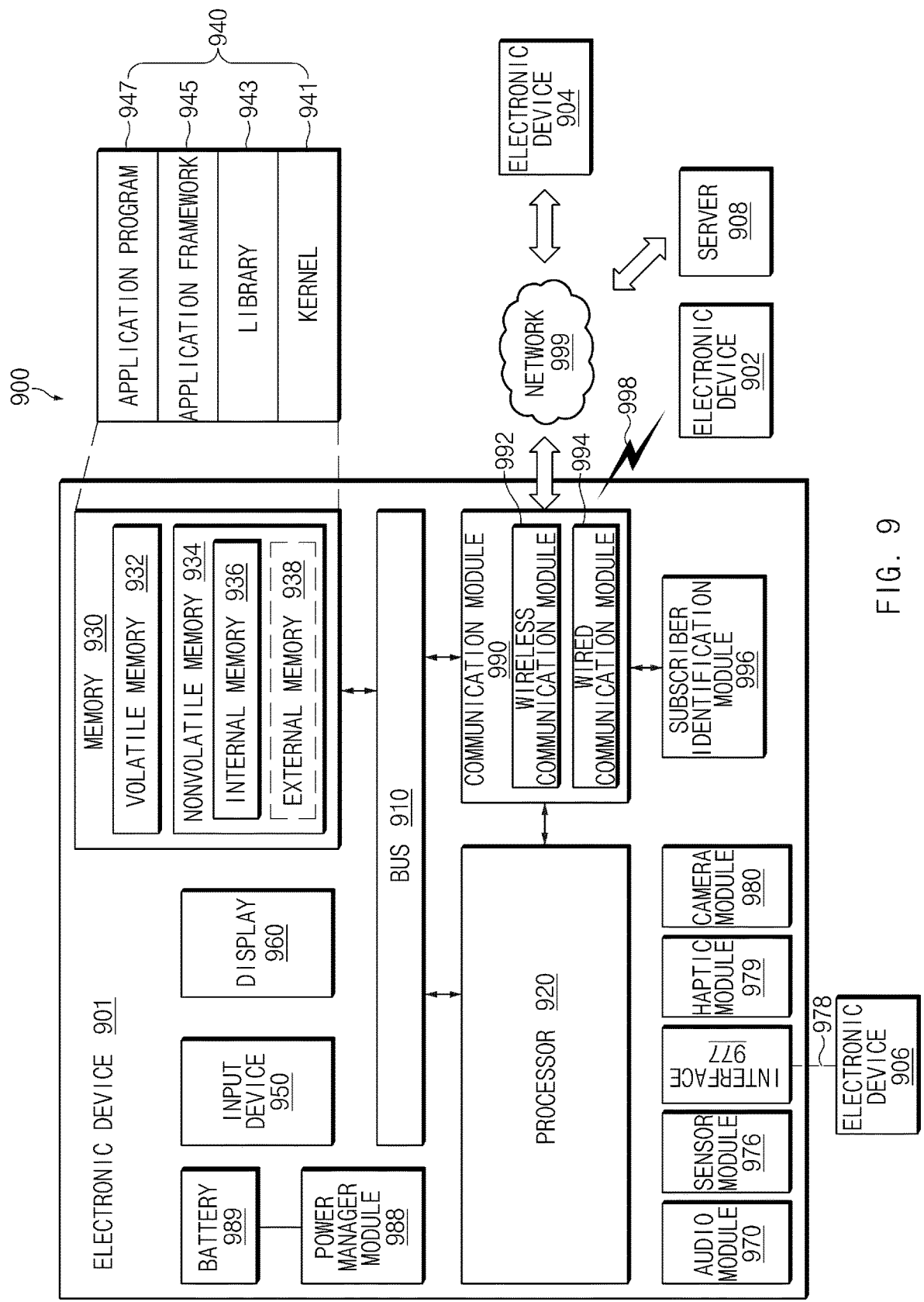
FIG. 9 illustrates an electronic device in a network environment according to various embodiments of the disclosure.

FIG. 9 illustrates an electronic device in a network environment according to various embodiments of the disclosure.

Referring to FIG. 9, under the network environment 900, the electronic device 901 may communicate with an external electronic device 902 through a local wireless network 998 or may communication with an external electronic device 904 or a server 908 through a network 999. According to an embodiment, the electronic device 901 may communicate with the external electronic device 904 through the server 908.

According to an embodiment, the electronic device 901 may include a bus 910, a processor 920, a memory 930, an input device 950 (e.g., a micro-phone or a mouse), a display 960, an audio module 970, a sensor module 976, an interface 977, a haptic module 979, a camera module 980, a power management module 988, a battery 989, a communication module 990, and a subscriber identification module 996. According to an embodiment, the electronic device 901 may not include at least one (e.g., the display 960 or the camera module 980) of the above-described elements or may further include other element(s).

For example, the bus 910 may interconnect the above-described elements 920 to 990 and may include a circuit for conveying signals (e.g., a control message or data) between the above-described elements. The processor 920 may include one or more of a CPU, an AP, a graphic processing unit (GPU), an image signal processor (ISP) of a camera or a communication processor (CP). According to an embodiment, the processor 920 may be implemented with a system on chip (SoC) or a system in package (SiP). For example, the processor 920 may drive an operating system (OS) or an application to control at least one of another element (e.g., hardware or software element) connected to the processor 920 and may process and compute various data. The processor 920 may load a command or data, which is received from at least one of other elements (e.g., the communication module 990), into a volatile memory 932 to process the command or data and may store the process result data into a nonvolatile memory 934.

The memory 930 may include, for example, the volatile memory 932 or the nonvolatile memory 934. The volatile memory 932 may include, for example, a random access memory (RAM) (e.g., a dynamic RAM (DRAM), a static RAM (SRAM), or a synchronous dynamic RAM (SDRAM)). The nonvolatile memory 934 may include, for example, a one-time programmable read-only memory (OT-PROM), a programmable read-only memory (PROM), an erasable programmable read-only memory (EPROM), an electrically erasable programmable read-only memory (EE- PROM), a mask read-only memory (ROM), a flash ROM, a flash memory, a hard disk drive, or a solid-state drive (SSD). In addition, the nonvolatile memory 934 may be configured in the form of an internal memory 936 or the form of an external memory 938 which is available through connection only if necessary, according to the connection with the electronic device 901. The external memory 938 may further include a flash drive such as compact flash (CF), secure digital (SD), micro-SD, mini-SD, extreme digital (xD), a multimedia card (MMC), or a memory stick. The external memory 938 may be operatively or physically connected with the electronic device 901 in a wired manner (e.g., a cable or a universal serial bus (USB)) or a wireless (e.g., Bluetooth) manner.

For example, the memory 930 may store, for example, at least one different software element, such as an instruction or data associated with the program 940, of the electronic device 901. The program 940 may include, for example, a kernel 941, a library 943, an application framework 945 or an application program (interchangeably, "application") 947.

The input device 950 may include a microphone, a mouse, or a keyboard. According to an embodiment, the keyboard may include a keyboard physically connected or a keyboard virtually displayed through the display 960.

The display 960 may include a display, a hologram device or a projector, and a control circuit to control a relevant device. The screen may include, for example, a liquid crystal display (LCD), a LED display, an organic LED (OLED) display, a microelectromechanical systems (MEMS) display, or an electronic paper display. According to an embodiment, the display may be flexibly, transparently, or wearably implemented. The display may include a touch circuitry, which is able to detect a user's input such as a gesture input, a proximity input, or a hovering input or a pressure sensor (interchangeably, a force sensor) which is able to measure the intensity of the pressure by the touch. The touch circuit or the pressure sensor may be implemented integrally with the display or may be implemented with at least one sensor separately from the display. The hologram device may show a stereoscopic image in a space using interference of light. The projector may project light onto a screen to display an image. The screen may be located inside or outside the electronic device 901.

The audio module 970 may convert, for example, from a sound into an electrical signal or from an electrical signal into the sound. According to an embodiment, the audio module 970 may acquire sound through the input device 950 (e.g., a microphone) or may output sound through an output device (not illustrated) (e.g., a speaker or a receiver) included in the electronic device 901, an external electronic device (e.g., the external electronic device 902 (e.g., a wireless speaker or a wireless headphone)) or an electronic device 906 (e.g., a wired speaker or a wired headphone) connected with the electronic device 901.

The sensor module 976 may measure or detect, for example, an internal operating state (e.g., power or temperature) or an external environment state (e.g., an altitude, a humidity, or brightness) of the electronic device 901 to generate an electrical signal or a data value corresponding to the information of the measured state or the detected state. The sensor module 976 may include, for example, at least one of a gesture sensor, a gyro sensor, a barometric pressure sensor, a magnetic sensor, an acceleration sensor, a grip sensor, a proximity sensor, a color sensor (e.g., a red, green, blue (RGB) sensor), an infrared sensor, a biometric sensor (e.g., an iris sensor, a fingerprint senor, a heartbeat rate monitoring (HRM) sensor, an e-nose sensor, an electromyography (EMG) sensor, an electroencephalogram (EEG) sensor, an electrocardiogram (ECG) sensor, a temperature sensor, a humidity sensor, an illuminance sensor, or an UV sensor. The sensor module 976 may further include a control circuit for controlling at least one or more sensors included therein. According to an embodiment, the sensor module 976 may be controlled by using the processor 920 or a processor (e.g., a sensor hub) separate from the processor 920. In the case that the separate processor (e.g., a sensor hub) is used, while the processor 920 is in a sleep state, the separate processor may operate without awakening the processor 920 to control at least a portion of the operation or the state of the sensor module 976.

According to an embodiment, the interface 977 may include a high definition multimedia interface (HDMI), a USB, an optical interface, a recommended standard 232 (RS-232), a D-subminiature (D-sub), a mobile high-definition link (MHL) interface, a SD card/MMC interface, or an audio interface. A connector 978 may physically connect the electronic device 901 and the electronic device 906. According to an embodiment, the connector 978 may include, for example, an USB connector, an SD card/MMC connector, or an audio connector (e.g., a headphone connector).

The haptic module 979 may convert an electrical signal into mechanical stimulation (e.g., vibration or motion) or into electrical stimulation. For example, the haptic module 979 may apply tactile or kinesthetic stimulation to a user. The haptic module 979 may include, for example, a motor, a piezoelectric element, or an electric stimulator.

The camera module 980 may capture, for example, a still image and a moving picture. According to an embodiment, the camera module 980 may include at least one lens (e.g., a wide-angle lens and a telephoto lens, or a front lens and a rear lens), an image sensor, an ISP, or a flash (e.g., a LED or a xenon lamp).

The power management module 988, which is to manage the power of the electronic device 901, may constitute at least a portion of a power management integrated circuit (PMIC).

The battery 989 may include a primary cell, a secondary cell, or a fuel cell and may be recharged by an external power source to supply power at least one element of the electronic device 901.

The communication module 990 may establish a communication channel between the electronic device 901 and an external device (e.g., the first external electronic device 902, the second external electronic device 904, or the server 908). The communication module 990 may support wired communication or wireless communication through the established communication channel. According to an embodiment, the communication module 990 may include a wireless communication module 992 or a wired communication module 994. The communication module 990 may communicate with the external device (e.g., the first external electronic device 902, the second external electronic device 904 or the server 908) through a local wireless network 998 (e.g. a wireless local area network such as Bluetooth or infrared data association (IrDA)) or a second network 999 (e.g., a wireless wide area network such as a cellular network) through a relevant module among the wireless communication module 992 or the wired communication module 994.

The wireless communication module 992 may support, for example, cellular communication, local wireless communication, and GNSS communication. The cellular communication may include, for example, long-term evolution (LTE), LTE-advanced (LTE-A), code division multiple access (CDMA), wideband CDMA (WCDMA), universal mobile telecommunications system (UMTS), wireless broadband (WiBro), or global system for mobile communications (GSM). The local wireless communication may include wireless fidelity (Wi-Fi), Wi-Fi Direct, light fidelity (Li-Fi), Bluetooth, Bluetooth low energy (BLE), Zigbee, near field communication (NFC), magnetic secure transmission (MST), radio frequency (RF), or a body area network (BAN). The GNSS may include at least one of a global positioning system (GPS), a global navigation satellite system (Glonass), Beidou Navigation Satellite System (Beidou), the European global satellite-based navigation system (Galileo), or the like. In the disclosure, "GPS" and "GNSS" may be interchangeably used.

According to an embodiment, when the wireless communication module 992 supports cellar communication, the wireless communication module 992 may, for example, identify or authenticate the electronic device 901 within a communication network using the subscriber identification module (SIM) (e.g., a SIM card) 996. According to an embodiment, the wireless communication module 992 may include a CP separate from the processor 920 (e.g., an AP). In this case, the CP may perform at least a portion of functions associated with at least one of elements 910 to 996 of the electronic device 901 in substitute for the processor 920 when the processor 920 is in an inactive (sleep) state, and together with the processor 920 when the processor 920 is in an active state. According to an embodiment, the wireless communication module 992 may include a plurality of communication modules, each supporting only a relevant communication scheme among cellular communication, short-range wireless communication, or a GNSS communication scheme.

The wired communication module 994 may include, for example, include a local area network (LAN) service, a power line communication, or a plain old telephone service (POTS).

For example, the local wireless network 998 may employ, for example, Wi-Fi direct or Bluetooth for transmitting or receiving instructions or data through wireless direct connection between the electronic device 901 and the first external electronic device 902. The second network 999 may include a telecommunication network (e.g., a computer network such as a LAN or a wide area network (WAN), the Internet or a telephone network) for transmitting or receiving instructions or data between the electronic device 901 and the second electronic device 904.

According to embodiments, the instructions or the data may be transmitted or received between the electronic device 901 and the second external electronic device 904 through the server 908 connected with the second network. Each of the external first and second external electronic devices 902 and 904 may be a device of which the type is different from or the same as that of the electronic device 901. According to various embodiments, all or a part of operations that the electronic device 901 will perform may be executed by another or a plurality of electronic devices (e.g., the external electronic devices 902 and 904 or the server 908). According to an embodiment, in the case that the electronic device 901 executes any function or service automatically or in response to a request, the electronic device 901 may not perform the function or the service internally, but may alternatively or additionally transmit requests for at least a part of a function associated with the electronic device 901 to any other device (e.g., the external electronic device 902 or 904 or the server 908). The other electronic device (e.g., the external electronic device 902 or 904 or the server 908) may execute the requested function or additional function and may transmit the execution result to the electronic device 901. The electronic device 901 may provide the requested function or service using the received result or may additionally process the received result to provide the requested function or service. To this end, for example, cloud computing, distributed computing, or client-server computing may be used.

Various embodiments of the disclosure and terms used herein are not intended to limit the technologies described in the disclosure to specific embodiments, and it should be understood that the embodiments and the terms include modification, equivalent, and/or alternative on the corresponding embodiments described herein. With regard to description of drawings, similar elements may be marked by similar reference numerals. The terms of a singular form may include plural forms unless otherwise specified. In the disclosure disclosed herein, the expressions "A or B", "at least one of A and/or B", "at least one of A and/or B", "A, B, or C", or "at least one of A, B, and/or C", and the like used herein may include any and all combinations of one or more of the associated listed items. Expressions such as "first," or "second," and the like, may express their elements regardless of their priority or importance and may be used to distinguish one element from another element but is not limited to these components. When an (e.g., first) element is referred to as being "(operatively or communicatively) coupled with/to" or "connected to" another (e.g., second) element, it may be directly coupled with/to or connected to the other element or an intervening element (e.g., a third element) may be present.

According to the situation, the expression "adapted to or configured to" used herein may be interchangeably used as, for example, the expression "suitable for", "having the capacity to", "changed to", "made to", "capable of" or "designed to". The expression "a device configured to" may mean that the device is "capable of" operating together with another device or other components. For example, a "processor configured to (or set to) perform A, B, and C" may mean a dedicated processor (e.g., an embedded processor) for performing corresponding operations or a generic-purpose processor (e.g., a CPU or an AP) which performs corresponding operations by executing one or more software programs which are stored in a memory device (e.g., the memory 930).

The term "module" used herein may include a unit, which is implemented with hardware, software, or firmware, and may be interchangeably used with the terms "logic", "logical block", "component", "circuit", or the like. The "module" may be a minimum unit of an integrated component or a part thereof or may be a minimum unit for performing one or more functions or a part thereof. The "module" may be implemented mechanically or electronically and may include, for example, an application-specific integrated circuit (ASIC) chip, a field-programmable gate array (FPGA), and a programmable-logic device for performing some operations, which are known or will be developed.

According to various embodiments, at least a part of an apparatus (e.g., modules or functions thereof) or a method (e.g., operations) may be, for example, implemented by instructions stored in a computer-readable storage media (e.g., the memory 930) in the form of a program module. The instruction, when executed by a processor (e.g., a processor 920), may cause the processor to perform a function corresponding to the instruction. The computer-readable recording medium may include a hard disk, a floppy disk, a magnetic media (e.g., a magnetic tape), an optical media (e.g., a compact disc-ROM (CD-ROM) and a DVD, a magneto-optical media (e.g., a floptical disk)), an embedded memory, and the like. The one or more instructions may contain a code made by a compiler or a code executable by an interpreter.

Each element (e.g., a module or a program module) according to various embodiments may be composed of single entity or a plurality of entities, a part of the above-described sub-elements may be omitted or may further include other elements. Alternatively or additionally, after being integrated in one entity, some elements (e.g., a module or a program module) may identically or similarly perform the function executed by each corresponding element before integration. According to various embodiments, operations executed by modules, program modules, or other elements may be executed by a successive method, a parallel method, a repeated method, or a heuristic method, or at least one part of operations may be executed in different sequences or omitted. Alternatively, other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a housing including a window disposed in at least a partial area of the housing and forming at least a portion of an outer surface of the electronic device;
   a touch screen display including an active area and a non-active area that face a first direction, the touch screen display being accommodated in the housing such that at least a portion of the touch screen display is visually exposed through the window;
   at least one processor accommodated in the housing and electrically connected to the touch screen display;
   a memory accommodated in the housing and electrically connected to the at least one processor;
   a first optical layer including at least one of a first area between an edge region of the active area and the window, and a second area between the non-active area and the window; and
   at least one opaque layer disposed between the second area of the first optical layer and the non-active area,
   wherein the first area includes a first bumpy structure that refracts light emitted from at least one of pixel of the edge region into the second area,
   wherein the at least one opaque layer includes a second bumpy structure corresponding to the first bumpy structure,
   wherein an area of the second bumpy structure is less than an area of the first bumpy structure, and
   wherein the first bumpy structure and the second bumpy structure extend to a side of the electronic device such that the refracted light is transferred through the first bumpy structure and the second bumpy structure to the side of the electronic device.

2. The electronic device of claim 1,
   wherein at least a portion of the first area is formed to face a second direction while forming a first obtuse angle with the first direction, and
   wherein the portion of the first area includes:
   a first surface formed to face the second direction; and
   a second surface formed to face a third direction while forming a second obtuse angle with the first direction.

3. The electronic device of claim 2, wherein the first surface and the second surface are alternately formed on at least a portion of a surface corresponding to the first area of the first optical layer.

4. The electronic device of claim 1, wherein the first optical layer includes an optical film having a portion that includes polyethylene terephthalate.

5. The electronic device of claim 1, further comprising:
   a second optical layer disposed between the first optical layer and the touch screen display.

6. The electronic device of claim 5, wherein the second optical layer includes at least one of a third area between the active area except for the edge region and the window, a fourth area between the edge region and the window, or a fifth area between the non-active area and the window.

7. The electronic device of claim 5, wherein the second optical layer includes at least one of a transparent adhesive or a transparent resin.

8. The electronic device of claim 1, wherein the window includes a curved area that faces at least one side surface of the touch screen display.

9. The electronic device of claim 8, wherein the curved area of the window is substantially perpendicular to a non-curved area of the window.

10. The electronic device of claim 8, wherein the first optical layer includes an extending area that extends to correspond to the curved area of the window.

11. The electronic device of claim 10, wherein the at least one opaque layer extends to correspond to the extending area of the first optical layer.

12. The electronic device of claim 11, further comprising:
    a first light emitter accommodated in the housing and disposed to face the curved area of the window.

13. The electronic device of claim 12, wherein the at least one opaque layer extends so as not to overlap a portion of the first light emitter.

14. The electronic device of claim 13, further comprising:
    a printed circuit board electrically connected to the touch screen display; and
    a second light emitter disposed on an area of the printed circuit board.

15. The electronic device of claim 14, further comprising:
    a reflection member accommodated in the housing and disposed in an area of the housing that faces the second light emitter, to reflect a portion of light emitted by the second light emitter.

16. The electronic device of claim 1, wherein the touch screen display includes a rigid display.

17. The electronic device of claim 1, wherein the memory stores at least one instruction that, when executed, causes the at least one processor to:
    display a user interface associated with execution of an application program on at least a partial area of a screen area of the touch screen display, and
    light the edge region of the active area in at least one color to show a strip shape through a window corresponding to an edge of the touch screen display or a window corresponding to the non-active area when viewed from outside the electronic device.

18. An electronic device comprising:
    a housing including a window disposed in at least a partial area of the housing and forming at least a portion of an outer surface of the electronic device;

a touch screen display including an active area and a non-active area, the touch screen display being accommodated in the housing such that at least a portion of the touch screen display is visually exposed through the window;

at least one processor accommodated in the housing and electrically connected to the touch screen display;

a memory accommodated in the housing and electrically connected to the at least one processor;

an optical layer disposed between the touch screen display and the window and at least one opaque layer disposed between the optical layer and the non-active area, wherein a portion of a surface area of the optical layer that faces the active area of the touch screen display is formed in a first bumpy structure, wherein the first bumpy structure refracts light emitted from at least one of pixel of the active area into an area between the window and the non-active area, wherein the at least one opaque layer includes a second bumpy structure corresponding to the first bumpy structure, wherein an area of the second bumpy structure is less than an area of the first bumpy structure, and wherein the first bumpy structure and the second bumpy structure extend to a side of the electronic device such that the refracted light is transferred through the first bumpy structure and the second bumpy structure to the side of the electronic device.

19. An electronic device comprising:

a housing including a window disposed in a partial area of the housing and forming a portion of an outer surface of the electronic device;

a touch screen display including an active area and a non-active area, the touch screen display being accommodated in the housing such that a portion of the touch screen display is visually exposed through the window;

an optical layer disposed between the touch screen display and the window; and at least one opaque layer disposed between the optical layer and the non-active area, wherein a portion of a surface area of the optical layer that faces the active area of the touch screen display is formed to be uneven, wherein the portion of the surface area refracts light emitted from at least one of pixel of the active area into an area between the window and the non-active area, wherein the at least one opaque layer includes a bumpy structure corresponding to another portion of the surface area of the optical layer, wherein an area of the bumpy structure is less than an area of the portion of a surface area of the optical layer, and wherein the first bumpy structure and the second bumpy structure extend to a side of the electronic device such that the refracted light is transferred through the first bumpy structure and the second bumpy structure to the side of the electronic device.

* * * * *